(12) United States Patent
Hudek et al.

(10) Patent No.: US 7,241,542 B2
(45) Date of Patent: Jul. 10, 2007

(54) PROCESS FOR CONTROLLING THE PROXIMITY EFFECT CORRECTION

(75) Inventors: Peter Hudek, Jena (DE); Dirk Beyer, Weimar (DE)

(73) Assignee: Leica Microsystems Lithography GmbH (DE)

( * ) Notice: Subject to any disclaimer, the term of this patent is extended or adjusted under 35 U.S.C. 154(b) by 112 days.

(21) Appl. No.: 11/165,312

(22) Filed: Jun. 23, 2005

(65) Prior Publication Data

US 2005/0287450 A1  Dec. 29, 2005

(30) Foreign Application Priority Data

Jun. 29, 2004  (EP) ................... 04103020

(51) Int. Cl.
*G03F 9/00* (2006.01)
(52) U.S. Cl. .................. 430/30; 430/296; 430/942; 716/19
(58) Field of Classification Search .................. 430/30, 430/296, 942; 716/19
See application file for complete search history.

(56) References Cited

U.S. PATENT DOCUMENTS 5,432,714 A  7/1995  Chung et al.

FOREIGN PATENT DOCUMENTS

EP  0 813 231 A1  12/1997

OTHER PUBLICATIONS

Cui, Zheng, et al., "Proximity Correction of Chemically Amplified Resists for Electron Beam Lithography," Microelectronic Engineering 41/42 (1998) pp. 183-186.
Simecek, Michal, et al., "A New Approach of E-beam Proximity Effect Correction for High-Resolution Applications," JPN. J. Appl. Phys., vol. 37 (1998) pp. 6774-6778.
Yang, Seung-Hune, et. al., "Fogging Effect Consideration in Mask Process at 50KeV E-Beam Systems," Proc. of SPIE, vol. 4889 (2002), pp. 786-791.
Stevens, L., et al., "Determination of the Proximity Parameters in Electron Beam Lithography Using Doughnut-Structures," Microelectronic Engineering 5 (1986) pp. 141-150.
Park, Eui Sang, et al., "Optimum PEC Conditions Under Resist Heating Effect Reduction for 90nm Node Mask Writing," Proc. SPIE, vol. 4889, Part Two, pp. 792-799.
Rishton, S.A., et al., "Point exposure distribution measurements for proximity correction in electron beam lithography on a sub-100nm scale," Journal of Vacuum Science & Technology B (Microelectronics Processing and Phenomena) USA, vol. 5, No. 1, pp. 135-141.
Misaka, Akio, et al., "Determination of Proximity Effect Parameters in Electron-Beam Lithography," J. Appl. Physics, vol. 68, No. 12, Dec. 15, 1990, pp. 6472-6479.
Vermeulen, P., et al., "Proximity-Effect Correction in Electron-Beam Lithography," Journal of Vacuum Science & Technology B (1989) Nov./Dec., No. 6, NY, pp. 1556-1560.
Harafuji, Kenji, et al., "Proximity Effect Correction Data Processing System for Electron Beam Lithography," Journal of Vacuum Science & Technology B, vol. 10, No. 1, 1992, pp. 133-142.

*Primary Examiner*—Christopher G. Young
(74) *Attorney, Agent, or Firm*—Houston Eliseeva LLP

(57) ABSTRACT

A process for controlling the proximity effect correction in an electron beam lithography system. The exposure is controlled in order to obtain resulting pattern after processing which is conform to design data. In a first step an arbitrary set patterns is exposed without applying the process for controlling the proximity correction. The geometry of the resulting test structures is measured and a set of measurement data is obtained. Within a numerical range basic input parameters for the parameters $\alpha$, $\beta$ and $\eta$, are derived from the set of measurement data. A model is fitted by individually changing at least the basic input parameters $\alpha$, $\beta$ and $\eta$ of a control function to measurement data set and thereby obtaining an optimised set of parameters. The correction function is applied to an exposure control of the electron beam lithography system during the exposure of a pattern according to the design data.

17 Claims, 24 Drawing Sheets

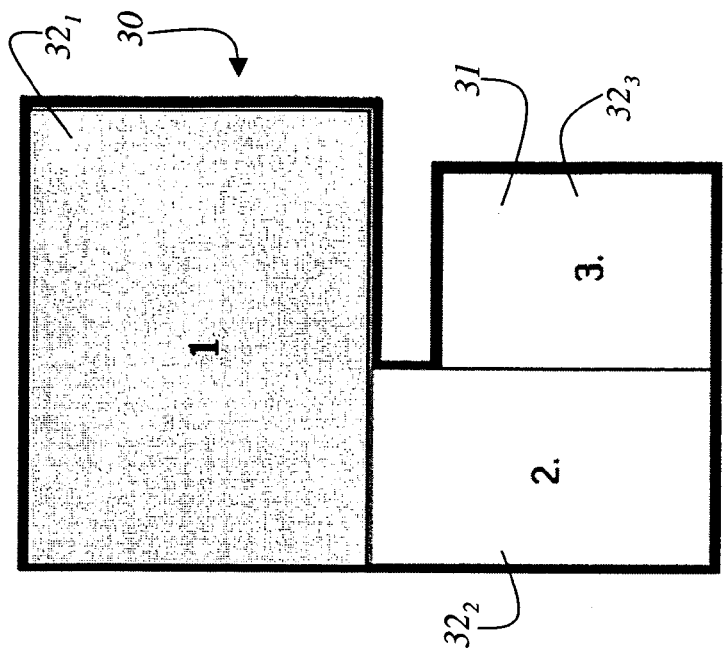
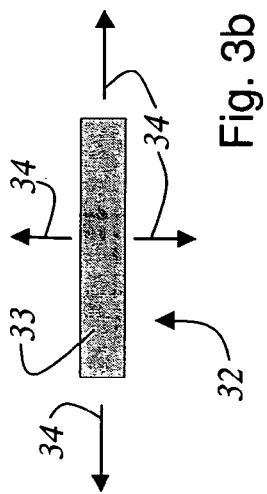
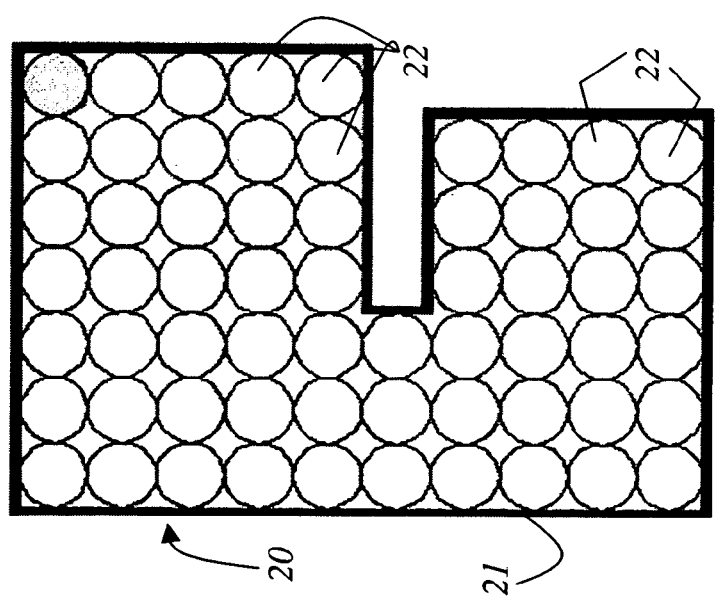
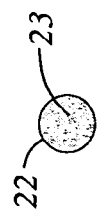
Fig. 3a
Fig. 3b
Fig. 2a
Fig. 2b

| GAP WIDTH [μm] | Measured [μm] | Calculated [μm] |
|---|---|---|
| 50 | 2 | 2,001 |
| 45 | 2,001 | 2,001 |
| 40 | 2,002 | 2,001 |
| 35 | 2,002 | 2,001 |
| 30 | 2,002 | 2,001 |
| 25 | 2,002 | 2,001 |
| 20 | 2,003 | 2,001 |
| 18 | 2,004 | 2,001 |
| 16 | 2,004 | 2,001 |
| 14 | 2,005 | 2,003 |
| 12 | 2,006 | 2,005 |
| 10 | 2,011 | 2,01 |
| 8 | 2,02 | 2,018 |
| 6 | 2,034 | 2,03 |
| 4 | 2,051 | 2,05 |
| 2 | 2,077 | 2,081 |
| 1 | 2,104 | 2,11 |
| 0,9 | 2,112 | 2,114 |
| 0,8 | 2,126 | 2,118 |
| 0,7 | 2,142 | 2,125 |
| 0,6 | 2,143 | 2,133 |
| 0,5 | 2,153 | 2,149 |

| 1. LW [um] | 2. Opt.Dose [uC/cm²] | 3. Line | 4. Dose Factors: Contact | 5. Dense | 6. / Middle | 7. Opaque Lines |
|---|---|---|---|---|---|---|
| 100.000 | 22.001 | 1.0000 | 1.0000 | 1.0000 | 1.0000 | 1.0000 |
| 50.000 | 22.001 | 1.0001 | 1.0001 | 1.0000 | 1.0000 | 1.0000 |
| 20.000 | 22.009 | 1.0004 | 1.0279 | 1.0000 | 0.9732 | 0.9996 |
| 15.000 | 22.094 | 1.0043 | 1.0619 | 1.0000 | 0.9451 | 0.9958 |
| 10.000 | 22.607 | 1.0276 | 1.1299 | 1.0000 | 0.9046 | 0.9739 |
| 9.500 | 22.711 | 1.0323 | 1.1391 | 1.0000 | 0.9007 | 0.9697 |
| 9.000 | 22.030 | 1.0377 | 1.1409 | 1.0000 | 0.0971 | 0.9650 |
| 8.500 | 22.963 | 1.0438 | 1.1590 | 1.0000 | 0.8939 | 0.9598 |
| 8.000 | 23.114 | 1.0506 | 1.1694 | 1.0000 | 0.8911 | 0.9540 |
| 7.500 | 23.282 | 1.0583 | 1.1802 | 1.0000 | 0.8889 | 0.9478 |
| 7.000 | 23.471 | 1.0668 | 1.1913 | 1.0000 | 0.8871 | 0.9411 |
| 6.500 | 23.679 | 1.0763 | 1.2024 | 1.0000 | 0.8859 | 0.9338 |
| 6.000 | 23.908 | 1.0867 | 1.2136 | 1.0000 | 0.8852 | 0.9261 |
| 5.500 | 24.161 | 1.0982 | 1.2240 | 1.0000 | 0.0040 | 0.9179 |
| 5.000 | 24.437 | 1.1108 | 1.2357 | 1.0000 | 0.8847 | 0.9093 |
| ⋮ | | | | | | |
| 0.500 | 28.073 | 1.2760 | 1.2998 | 1.0000 | 0.8843 | 0.8222 |
| 0.450 | 28.125 | 1.2784 | 1.3011 | 1.0000 | 0.8825 | 0.8212 |
| 0.400 | 28.177 | 1.2808 | 1.3056 | 1.0000 | 0.8811 | 0.8202 |
| 0.350 | 28.229 | 1.2831 | 1.3172 | 1.0000 | 0.8744 | 0.8192 |
| 0.300 | 28.283 | 1.2856 | 1.3454 | 1.0000 | 0.8586 | 0.8183 |
| 0.250 | 28.346 | 1.2885 | 1.4090 | 1.0000 | 0.8253 | 0.8171 |
| 0.200 | 28.519 | 1.2965 | 1.5490 | 1.0000 | 0.7637 | 0.8140 |
| 0.150 | 29.432 | 1.3378 | 1.8920 | 1.0000 | 0.6636 | 0.7984 |
| 0.100 | 33.789 | 1.5359 | 2.9637 | 1.0000 | 0.5415 | 0.7414 |
| 0.090 | 35.738 | 1.6244 | 3.4307 | 1.0000 | 0.5233 | 0.7223 |
| 0.080 | 38.385 | 1.7448 | 4.0890 | 1.0000 | 0.5104 | 0.7009 |
| 0.070 | 42.033 | 1.9106 | 5.0550 | 1.0000 | 0.5002 | 0.6772 |
| 0.060 | 47.187 | 2.1448 | 6.5507 | 1.0001 | 0.5005 | 0.6520 |
| 0.050 | 54.752 | 2.4887 | 9.0383 | 1.0004 | 0.5000 | 0.6257 |

PROCESS FOR CONTROLLING THE PROXIMITY EFFECT CORRECTION

RELATED APPLICATIONS

This application claims priority of the European patent application EP 04 103 020.6 which is incorporated by reference herein.

FIELD OF THE INVENTION

The invention refers to process for controlling the proximity effect correction in an electron beam lithography system. The process is suitable for precise numerical determination of the proximity parameters of the Point Spread Function (PSF) for optimised controlling the proximity correction in the high-resolution electron beam lithography (EBL).

BACKGROUND OF THE INVENTION

The proximity effect parameters are specific numerical inputs to control an arbitrary Proximity-Effect correction software. This satisfies high Critical Dimension control "CD-control" requirements (depending on actual International Technology Roadmap for Semiconductors ITRS from International SEMATECH) as well as to compensate pattern bias in the Mask and/or Direct-Write working with Gaussian and/or Shaped beam in connection with the subsequent technology steps (development, etching, etc.).

Many methods have been proposed for the determination of the proximity parameters reflecting various effectiveness. In addition to the proximity effect a fogging effect occurs simultaneously in a electron beam lithographic system. There are several publications, which deal with the proximity effect correction.

The article "Optimum PEC Conditions Under Resist Heating Effect Reduction for 90 nm Node Mask Writing"; disclosed in Proc. SPIE, Vol. 4889, Part Two, pp 792-799 (paper No. 86), show the problem of 50 k V e-beam writing causing critical dimension (CD) change, resist heating and proximity effect. This experimental method is used for determination of the proximity input-parameters in the mask making process using large area matrices of proximity-corrected test patterns written under various conditions with discrete step-by-step individually changed proximity parameters. The optimal parameter set is then determined from direct measurements on these test patterns where the pattern deformation effects are minimal. The experiment and also the pattern evaluation is highly time consuming. Because of the large number of possible combinations of the input parameters, the method is limited to only 2 Gaussian approximation of the resulting PSF. This method is massively used in the mask production.

The article in Microelectronic Engineering 5 (1986) 141-159; North Holland with the title "Determination of the Proximity Parameters in Electron Beam Lithography Using Doughnut-Structures". The test structures, used to determine the parameters for a correction function, are doughnuts. This method offers a straightforward technique for determining the proximity parameters from an array of exposed donuts by means of optical microscopy. This method is not sensitive enough to achieve CD control with a e-beam and not suitable for high-resolution patterning EBL methods.

In the article "Point Exposure Distribution Measurements for Proximity Correction Electron Beam Lithography on a sub-100 nm Scale"; in J. Vac. Sci. Technol. B 5(1), January/February 1987 a single point/pixel is exposed in a wide range of doses and the diameters of the patterns measured and the results directly approximated by Gaussian functions. The method is applicable for special high-contrast resist only (i.e. insensitive to changes in development rate effects), needs high-resolution measurement technique (SEM) and also additional processes ("lift-off" or deposition coatings of patterns). This method may not be applicable to the commercially used Chemically Amplified Resists (CAR). With the point exposure method using extremely high doses, acid diffusion effect may outweigh the true nature of the proximity effect [Z. Cui, Ph.D. Prewett, "Proximity Correction of Chemically Amplified Resists for Electron Beam Lithography", Microelectronic Engineering 41/42 (1998) 183-186].

The article "Determination of Proximity Effect Parameters in Electron-Beam Lithography" in J. Appl. Phys. 68 (12), 15 Dec. 1990, discloses a empirical method for determining the proximity parameters in electron-beam lithography from rectangular array of mesh patterns from which, after the processing proximity parameters should be retrieved by means of light-optical inspection. A test pattern to be measured is used to determine the proximity effect. This method is not suitable for the contemporary conventional high-resolution production e-beam lithography systems.

In some publications the fogging effect is considered as well. The article "Fogging Effect Consideration in Mask Process at 50 KeV E-Beam Systems" shows a suggestion to reduce the fogging effect in high voltage electron e-beam systems. The fogging effect influences for example the difference between a calculated/theoretical feature width and the experimental feature with generated by the lithographic process.

The article in Microelectronic Engineering 5 (1986) 141-159; North Holland with the title "Determination of the Proximity Parameters in Electron Beam Lithography Using Doughnut-Structures".

The article "Determination of Proximity Effect Parameters in Electron-Beam Lithography" in J. Appl. Phys. 68 (12), 15 Dec. 1990, discloses as well influence of the fogging effect on the resulting features of a lithographic process.

SUMMARY OF THE INVENTION

It is the object of the present invention to create a method which allows a reliable correction of the illumination parameters of a e-beam lithographic system by considering the influence of the fogging effect.

The above object is achieved by a process as claimed in claim 1

The above object is achieved by a process for controlling the proximity effect correction in an electron beam lithography system wherein the exposure is controlled in order to obtain resulting pattern after processing which are conform to design data comprising the steps of:

exposing an arbitrary set patterns without applying the process for controlling the proximity correction;

measuring the geometry of the resulting test structures and thereby obtaining a set of measurement data;

determining a numerical range of proximity of basic input parameters $\alpha$, $\beta$ and $\eta$, from the set of measurement data;

fitting a model by individually changing at least the basic input parameters $\alpha$, $\beta$ and $\eta$ of a control function to measurement data set and thereby obtaining an optimised set of parameters, applying the correction function to an exposure control of the electron beam lithography system during the exposure of a pattern according to the design data.

Additionally, it is useful to apply the determined proximity parameter set to a calculation and comparison of the results with the measured data set with nominal doses exposed isolated clear and opaque lines, "ON THE TARGET". Another possibility is to apply the fitted proximity parameter set to a calculation and a comparison of the results with the measured data set from other arbitrary pattern, which is a pyramid like pattern and comparing the results with the measured data set from measurements in representative points on the test patterns. A further possibility is to apply the fitted proximity parameter set to a calculation and a comparison of the results with the measured data set from other arbitrary pattern, which is a plurality of lines in Duty-Ratio and comparing the results with the measured data set from measurements in representative points on the test patterns.

The method is based on the analysis of the pattern geometry variation as a direct process response (electron energy, resist material, substrate material, pre- and post-exposure processes, pattern transfer, etc.) to non-interacting and/or interacting non-corrected patterns in the EBL. The measured pattern-variation behaviour is reconstructed using a back-simulation by inserting the specified proximity parameters into the model. From the model calculated data represent the lateral contour localizations of the simulated pattern at the same points where they were measured on the real pattern. A comparison of measured data with the calculated results at the same points on a representative test pattern (single clear/opaque lines, pyramid like patterns, array of lines in duty-ratio, etc.) visualise the quality of the determined proximity parameter set.

In the case, that the requested requirement,—that the correction algorithms are working under the same model conception as used in the model—is fulfilled, the method all at once also predicts the possible pattern uniformity deviations (pattern conformity) and the resolution limits after using the actually determined proximity parameter set in the proximity correction.

The present invention has the advantage that uses a model-based analyses and interpretations of native geometrical distortions of exposed non-corrected representative patterns (analysing the direct process response as a typical pattern-geometry variation) which are measured in specified points (using commercial measuring tools, e.g. CD-SEM) and the data are recorded for the subsequent processing. A successive "back-simulation" procedure is used for the best possible reconstruction of these effects. "Back-Simulation" means a computational method how to find the optimum numerical input parameter set for the best approximation of the measured geometry variation of a concrete pattern detail in dependence on pre- and post exposure condition and/or proximity (pattern-size and neighbourhood) effects (=pattern and process reconstruction). Once such a pattern detail can be the dimensional variation of a pattern in a specified point as a function of the exposure intensity (e.g. in the simplest case line width and/or contact dimensional variation vs. exposure dose in both tonalities). Another variable can be for example the location of a neighbourhood pattern (e.g. line width measurements vs. gap width variation of large pads—pyramid-like patterns, and/or lines in gratings—lines in duty-ratio). In consequence, after inserting the obtained parameters into the model, the appropriate simulations should show the same tendency of pattern geometry variations dependency as obtained from measurements.

Accordingly, if the correction algorithms are working under the same model conception as used in the model, it results in a good recovery of the parasitic distortion effects using these input parameter sets in the proximity correction. Measurements and simulations can be performed down to the smallest resolvable pattern dimension, which allows also a precise determination of parameters describing the so known "short-range" effects arising from the forward scattering of electrons, secondary electron distribution, beam blur, resist effects (development, acid diffusion, quenching) and pattern transfer (microloading). Consequently, the proximity corrector with working with this parameter set will be able to work correctly also in the deep sub-100 nm lithography node.

Experimental measurements on a couple of exposed patterns (described in Appendix "Test patterns") are the precondition to provide all necessary numerical inserts into the PROX-In (PROX-In is a user-friendly Windows™ based software tool serving as a help for lithographers to determine the proximity effect parameters) active-free edit dialog boxes and to create simple ASCII-files containing the measured data. Subsequently these data serve as the basis for the selected particular built-in algorithms required for the proximity parameter determination in this program. To maximally avoid pattern degradations/distortions with submicron features it is unavoidable to apply a correction method for handling this effect. Existing techniques rely on: a) shot-by-shot modulation of the exposure dose, b) a modification of the pattern geometry, or c) combining of both methods mentioned before.

The main advantages of this process is, that it does not employ large matrices of exposed proximity-corrected patterns with various input parameters. The parameters will be here determined from measurements on non-corrected simple test patterns. The amount of data and/or parameters to be analysed are reduced enormously. The advantage of the present invention is as follows. The present invention uses only a small amount of a relatively simple set of test patterns exposed. The substrate (5-inch and larger) area covered by the test pattern which is limited to under 1%. Furthermore the test patterns are exposed without any proximity correction. Additionally there is the possibility to vary the global pattern loading by help of substrate "dummy" exposures of additional assistant patterns around the test patterns. This allows to determine the changes of pattern load depending on bias in the development and/or etching process. There is the additional possibility to directly observe the tendency of pattern degradation by individual varying the value of one of the input parameters. Then there is an interactive fine-tuning of the input parameters to achieve the best possible CD-requirements (CD-Linearity). The use of two or more Gaussian input parameter sets (Gaussian functions) with a direct check possibility, where and why the additional Gaussian functions with the various parameters are needed, enable the to achievement of better results. The back-simulation and reconstruction of specific pattern details for arbitrary proximity parameter sets allows a prediction of possible changes in the CD for the given parameter set for various geometry combinations of patterns.

A computer program "PROX-In" was developed and realized for optimisation and testing purposes of the method described in this application under real conditions in the production.

BRIEF DESCRIPTION OF THE DRAWINGS

The nature and mode of operation of the present invention will now be more fully described in the following detailed description of the invention taken with the accompanying drawing figures, in which:

FIG. 2a is an example for a pattern written with a Gaussian beam;

FIG. 2b is the shape of the cross section of the Gaussian beam, which has a constant diameter;

FIG. 3a is an example for a pattern written with a shaped beam;

FIG. 3b is the shape of the cross section of the shaped beam, wherein the shape can be adjusted according to the pattern which needs to be written;

FIG. 4a shows simulated trajectories for 100 electrons scattered in a Poly-(Methyl-MethAcrylate) (PMMA) coated on a GaAs substrate;

FIG. 4b shows simulated trajectories for 100 electrons scattered in a Poly-(Methyl-MethAcrylate) (PMMA) coated on a GaAs substrate, wherein the primary energy of the electrons is higher as in the calculation shown in FIG. 4a;

FIG. 13 shows a sub-window of the first part of the main window on the display or user interface used for the calculation of $\alpha$;

FIG. 14 shows a sub-window of the first part of the main window on the display or user interface used for the calculation of $\beta$ and $\eta$;

FIG. 22 shows a comprehensive table with calculated results from the model;

DETAILED DESCRIPTION OF THE INVENTION

Figure 1:
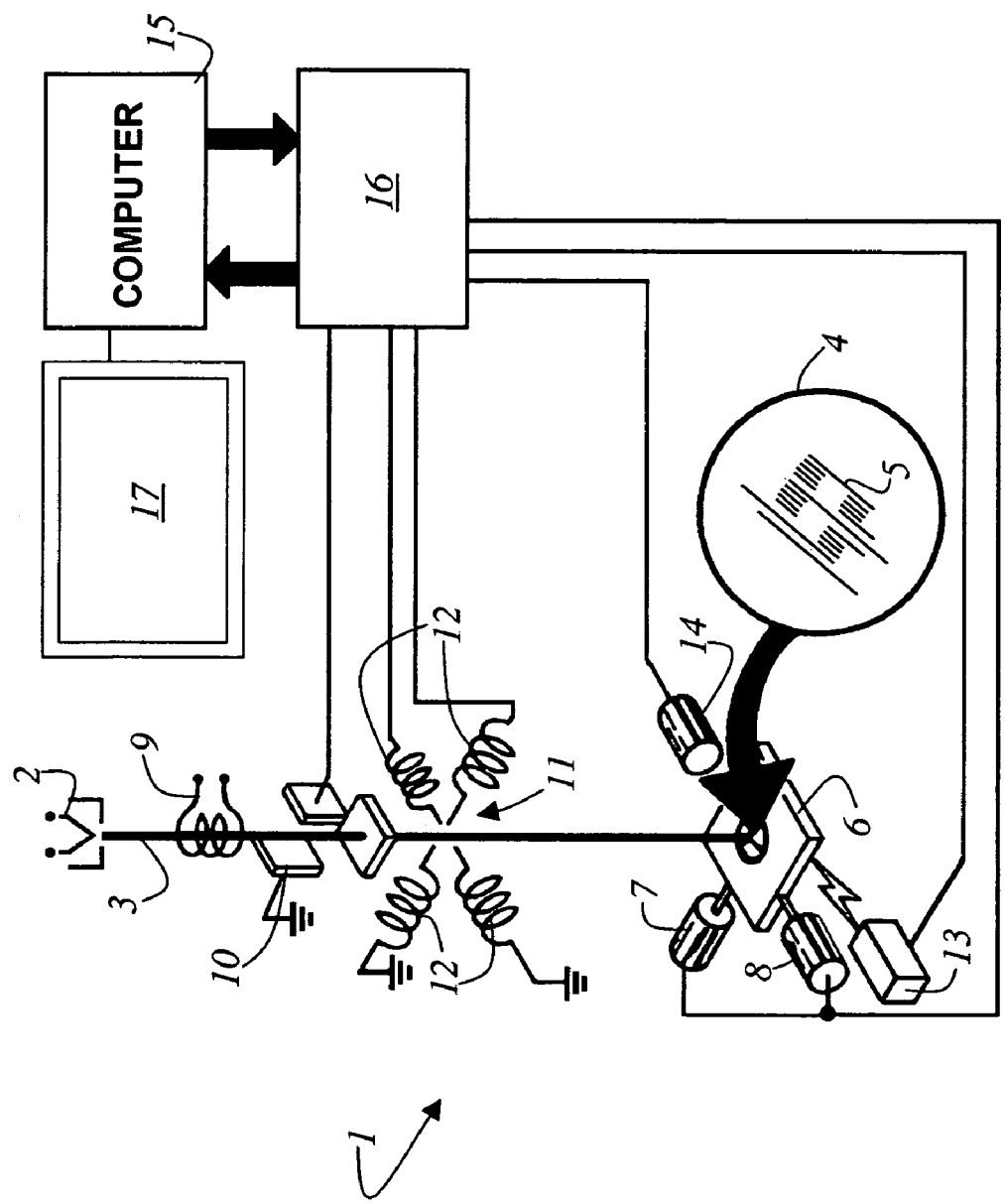
FIG. 1 is a block diagram of an e-beam lithographic system.

FIG. 1 shows a block diagram of an e-beam lithographic system 1. The e-beam lithographic system 1 has an e-beam source 2 which emits an e-beam 3. The specification mentions the use of an e-beam 3 only. Nevertheless, it has to be understood that the invention is not limited to e-beams only. The invention can be used with particle beams in general, which are applicable to write a pattern 5 on substrate 4. The substrate 4 itself is placed in stage 6 which can be moved by electric motors 7 and 8 in a plane which is spanned by the X-coordinate X and the Y-coordinate Y. The e-beam 3 passes beam alignment coil 9 after the emerge from the e-beam source 2. After the beam alignment coil 9, in the direction of e-beam 3 propagation, a beam blanking unit 10 is provided. After that the e-beam 3 reaches a magnetic deflection unit 11, which comprises in general four magnetic coils 12. After that the e-beam 3 is directed to the substrate 4. As already mentioned the substrate 4 is positioned on the stage 6. The actual position of the stage is controlled by a position feedback device 13. Additionally, an electron detector 14 is positioned in close proximity of the stage 6. A computer 15 is provided for controlling the whole e-beam lithographic system 1. Especially, to control, measure and adjust the beam parameters in order to produce pattern with a constant dimension. The computer 15 is linked to the e-beam lithographic system 1 by an interface 16, which carries out the analog to digital and/or the digital to analog conversion. The interface 16 is connected to the beam blanking unit 10, the magnetic deflection unit 11, position feedback device 13, the electron detector 14 and the electric motors 7 and 8 for moving the stage 6. The user is informed via a display 17 about the settings and/or the adjustment parameters of the e-beam lithographic system 1.

FIG. 2a is an example for a pattern 20 which covers a certain area 21 and the area 21 is filled with a plurality of Gaussian beams 22. Each of the Gaussian beams 22 has the same diameter. In FIG. 2b the shape of the cross section 23 of the Gaussian beam 22 is shown. The plurality of beams cover the area 21, which the pattern 20 requires.

FIG. 3a shows an example for a pattern 30 which is written with a shaped beam 32. The total area 31 of the pattern 30 is cover by a plurality of variable shaped figures. The variable shaped figures fill the area of the pattern 31 to be written. In the present case the area 31 is covered by three different shapes $32_1$, $32_2$ and $32_3$ of the electron beam. FIG. 3b shows the shape of the cross section 33 of the shaped beam 32, wherein the shape of the individual beams can be adjusted according to the pattern which needs to be written. As shown in FIG. 3b, the shape of the beam can be changed. This is indicated by the arrows 34.

In both cases (Gaussian beam or Shaped beam) the submicron features or pattern became the crucial factor for mask writing. With this pattern size, e-beam lithographic systems are confronted with common parasite electron scattering effects, which cause unwanted exposure depositions in the area surrounding the pattern to be written. This parasite electron scattering effects are known as proximity effects (see for example: T. H. P. Chang, "Proximity effect in electron beam lithography," J. Vac. Sci. Technol. 12 (1975) p. 1271). In case the minimum feature size becomes less than the backscattered range of electrons, pattern coverage affects the dimensional control of the pattern to be written. On the other hand, forward scattering limits the maximum resolution. The difference between back-ward and forward scattering increases as the energy of the electrons increases. Any pattern detail, which falls within a specific area, suffers significant distortions from his originally designed size and shape in the realized resulting lithographic pattern image. To maximally avoid pattern degradations/distortions with submicron features it is unavoidable to apply a correction method for handling this effect.

Figures 4A, 4B:
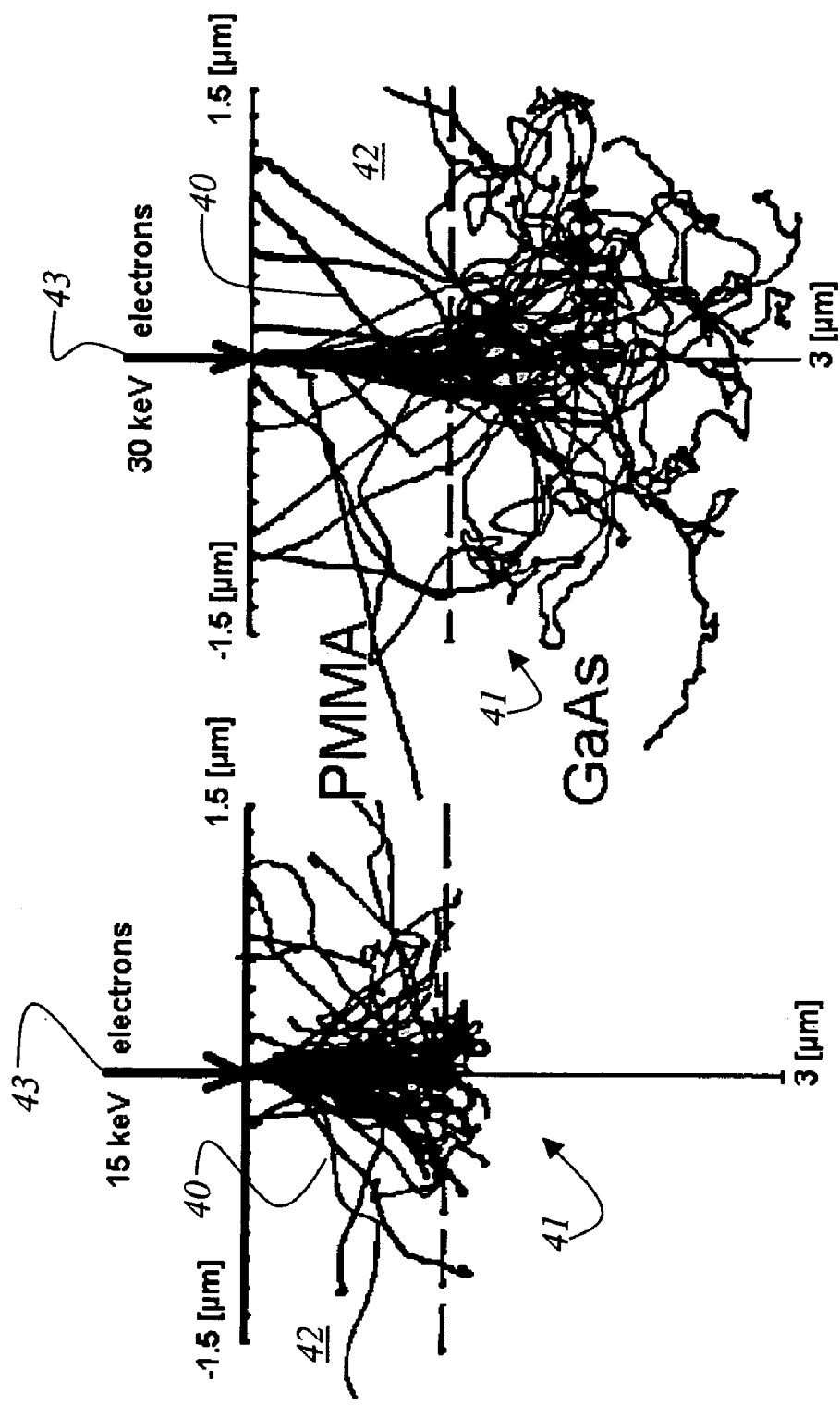

FIG. 4a shows simulated trajectories 42 for one hundred electrons scattered in a Poly-(Methyl-MethAcrylate) layer 40 (PMMA), which defines a resist, coated on a GaAs substrate 41. The primary energy of the electrons is set to 15 keV. As the e-beam 43 impinges on the PMMA-layer the electrons are scattered and move according to the calculated trajectories. FIG. 4b shows simulated trajectories for 100 electrons scattered in the PMMA-layer 40 coated on a GaAs substrate 41, wherein the primary energy of the electrons is higher as in the calculation shown in FIG. 4a. In electron beam lithography the dominant distortion originates from the interaction of electrons with the resist/substrate system convoluted with additional effects, which are not exactly detachable and separately treatable. Here the major role plays the absorbed energy density distribution (AEDD) spread in the resist with the corresponding radiation-chemical event distribution in the resist volume creating the latent image (resist differentiation) in the resist. A modeling of the AEDD in the resist layer is possible by using statistical (Monte Carlo) or analytical (Transport Equation) calculations of electron-scattering processes. The real latent image is then created by local chemical modifications of the irradiated resist volume after absorbing a necessary radiation quantum from the exposure.

Figure 5A:
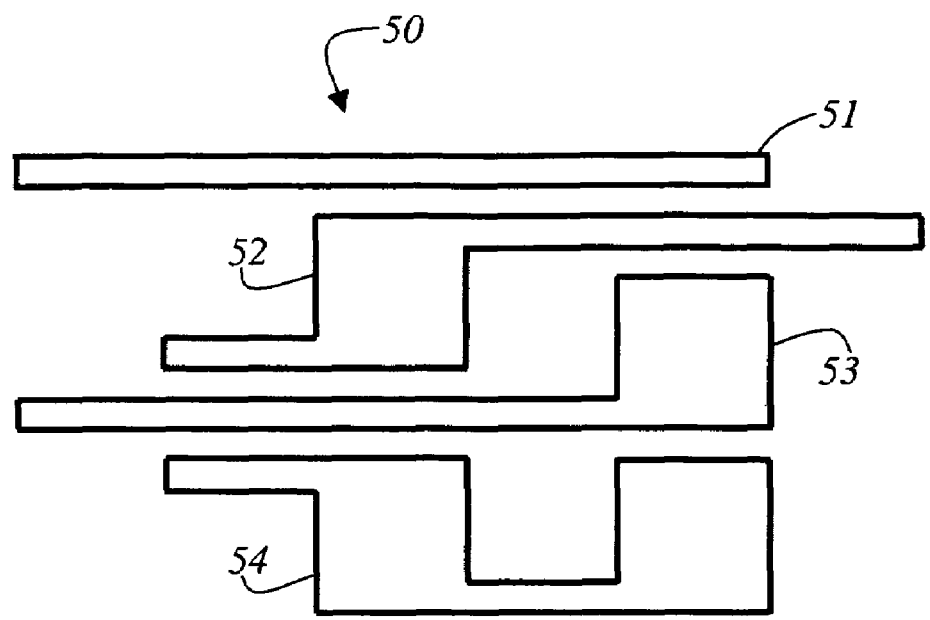
FIG. 5a shows a schematic view of the form of a pattern which needs to written in a resist on a substrate.

FIG. 5a shows a schematic view of the form of a pattern 50 which needs to written in a resist on a substrate. The pattern 50 has four distinct features, which are clearly described by their dimensions as resulting form the design data from the pattern. The first feature 51 is a straight line with a defined width. The second feature 52 is a land of rectangular shape. A straight line extends from the upper corner and form the lower corner of the land. The third feature 53 is a land of rectangular shape. A straight line extends form the lower corner of the land to the left. The fourth feature 54 comprises two lands. The two lands are connected with a straight line at their lower corners. An additional straight line extends from the upper corner of one land to the left.

Figure 5B:
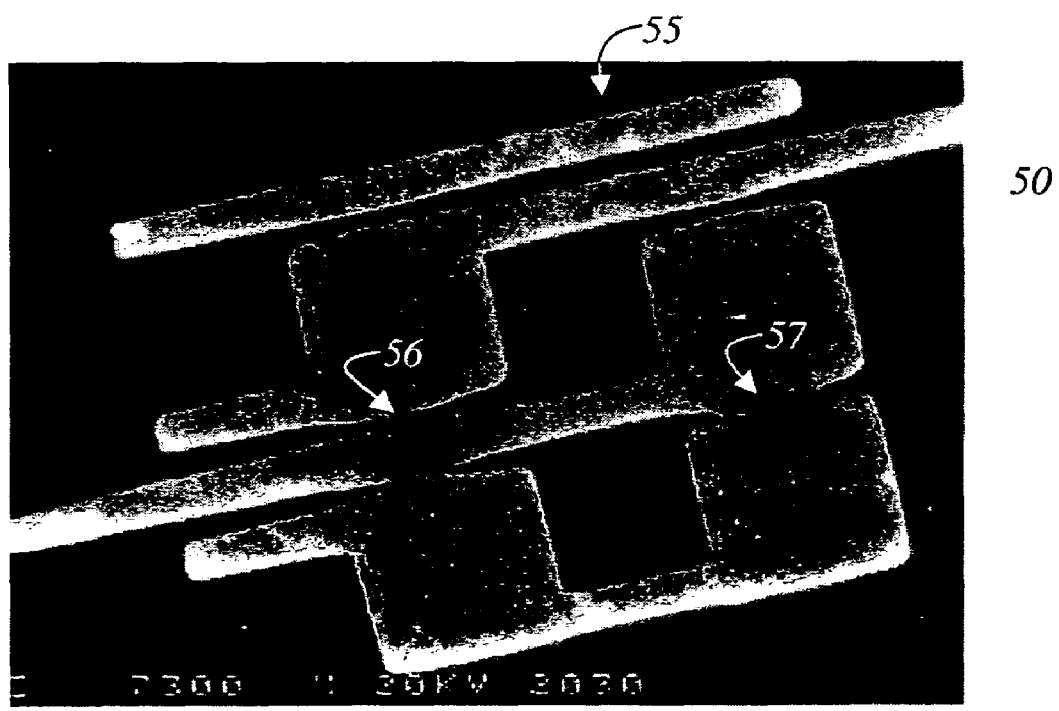
FIG. 5b shows the result of the pattern which was written in the resist and no correction according to the invention is was applied.

FIG. 5b shows the resulting pattern 55 which was written in the resist and wherein no correction according to the invention was applied. The proximity effect in the resist layer becomes clearly visible. In a first location 56, where two lands are separated by a line, there occurs a remarkable broadening of the line width and a bending of the shape of both lands. There is no longer a separation between the lands and the line. At a second location 57 where two lands are opposing each other the distortion results in an interconnect between those two lands.

Figure 6:
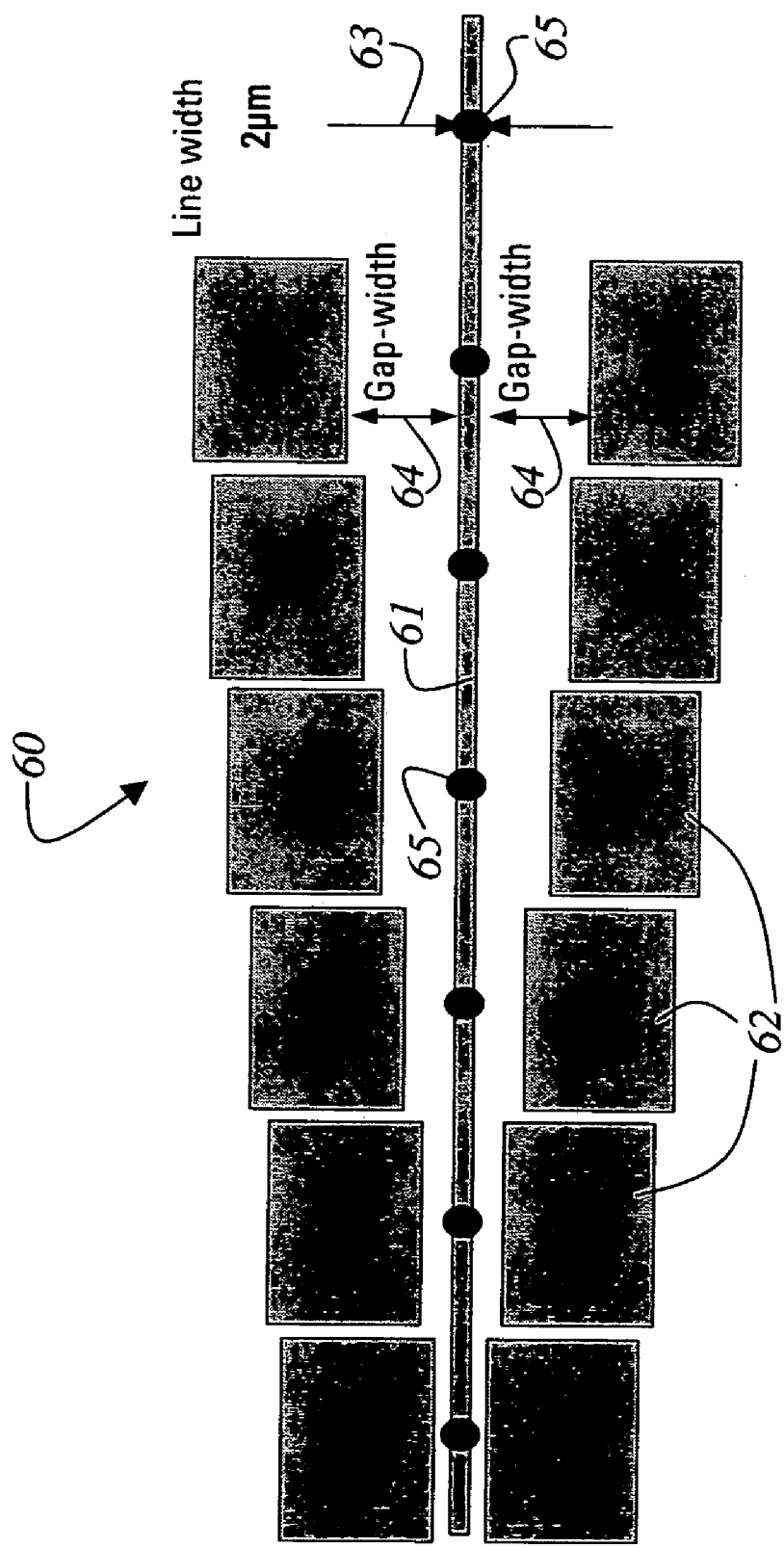
FIG. 6 shows a first test pattern which is written into the resist.

FIG. 6 shows a first possible (already implemented in PROX-In) test pattern 60 which is written into the resist. The procedure to back-simulate this first test pattern 60 is named pyramid "PYR" (uses a pyramid-like test pattern 60). This special process can be initiated by the user via the PROX-In user interface (see FIG. 8). The procedure allows to determine the input parameters after analyzing the experimentally measured data from line width variation of the exposed symmetrical pyramid test pattern 60. The first test pattern 60 contains one line 61, which has a predefined line width 63. On both sides of the predefined line 61 large pads 62 are exposed with a varying gap width 64 along the measured line 61. In the non-corrected case the predefined single clear line width 63 increases with decreasing gap width 64 between measured line 61 and large pads 62. The measurement is taken at locations which are marked with points 65 in FIG. 6. The dependence of the designed gap width vs. measured line width 63 is the base for the acquired-input for calculation and the back-simulation of this process (see FIG. 9). The first column 91 of the obtained data consists of the designed and exposed gap widths indicated in [μm] (descending) while the second column 92 contains the appropriate line width 63 of the exposed and measured line width. For this procedure it is necessary to find the optimum exposure dose for the non-corrected pyramid test pattern 60, where the single predefined exposed line (e.g. line on the right-side of the first test pattern 60 in FIG. 6 is not-influenced by large areas) meets the target. The very first top value shown in FIG. 9 is a start value of the line-width 61 (here for example 2 μm) for a very large gap width 64.

Figure 7:
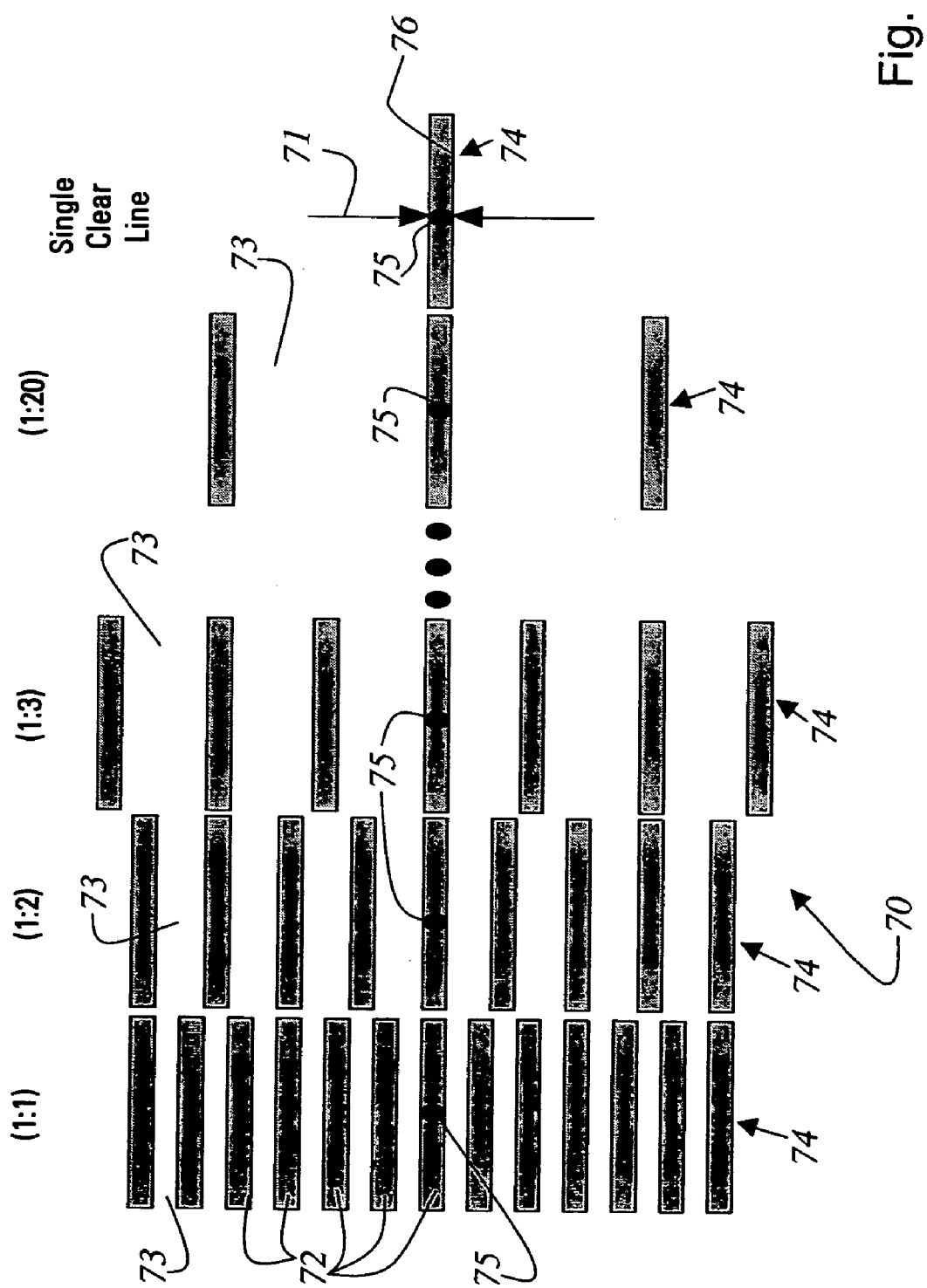
FIG. 7 shows a second test pattern which is written into the resist.

FIG. 7 shows a second possible test pattern 70 also already implemented in PROX-In which can be used for the direct proximity parameter determination. Similar to the other previously described method this procedure is based on line width 71 measurements of exposed non corrected Duty-Ratio-Test patterns "DRT". A plurality of lines 72 are exposed in the resist and/or further processed. The lines 72 are created in arrays 74 of various pitches 73 between the lines. This special process can be initiated by the user via a special PROX-In user interface (see FIG. 10). The procedure allows to determine the proximity input parameters after analyzing the experimentally measured data from representative line 75 width variation of the exposed symmetrical second test pattern 70. To receive the acquired file (see FIG. 11), data in two columns in the form are provided. The first column 111 is the Duty-Ratio parameter as a number 1, 2, 3, . . . , 20 of the ratio (1:1, 1:2, 1:3, . . . , 1:20). The second column 112 is the measured line width to the appropriate ratio in μm. It is necessary to measure the variation of the line width somewhere from the middle of each array 74 for various Line/Space rates. Bullet points 75 in FIG. 7 indicate the locations where the measurements are taken. It is important that before starting the "DRT" measurement procedure it is necessary to determine the optimum exposure dose for the single-clear-line 76 on the right side of the second test pattern 70. In other word the measured single clear line has the line width as required by the CAD-data and the patterned line meets the target as good as possible.

Figures 8, 9:
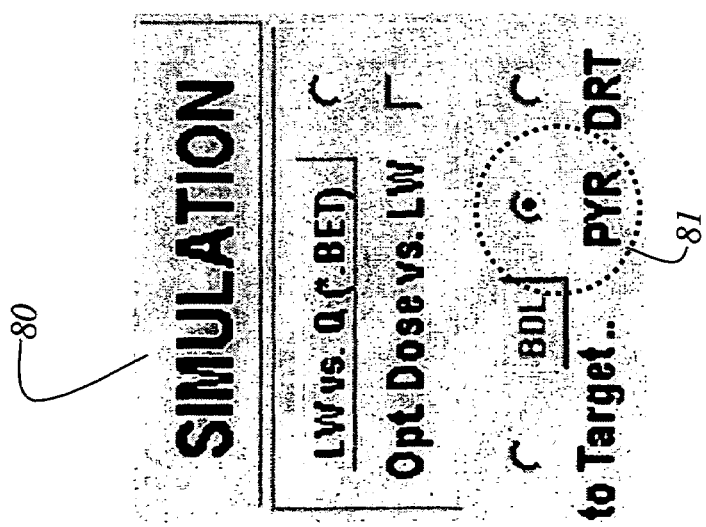
FIG. 8 shows an input window for the user to initiate the exposure of the first test pattern as shown in FIG. 6.
FIG. 9 shows a table of measurement result gained from the exposed first test pattern.
Figure 9A:
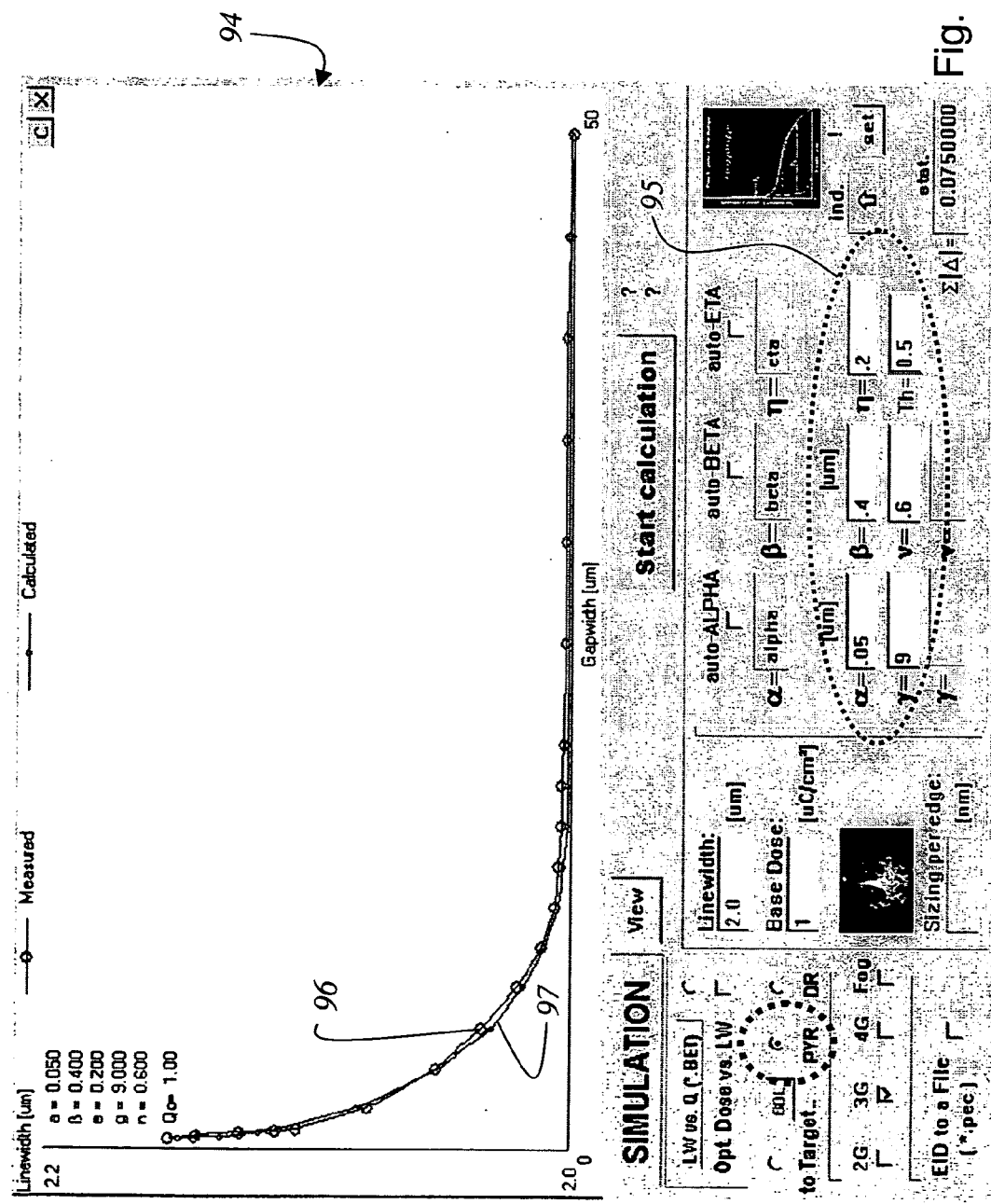
FIG. 9a shows the result in a graph form from PROX-In, where the goal is to find a parameter set.

FIG. 8 shows an input window 80 for the user to initiate the exposure of the first test pattern 60 as shown in FIG. 6. The user selects the pyramid procedure by setting a mark (check the "PYR" button) 81 above the indicated "PYR"

name and the back-simulation procedure starts. The result is shown in a table 90 (see FIG. 9). The measurement result, gained from the exposed first pyramid test pattern 60 is disposed in the second (middle) column 92. The first column 91 shows the gap width and the third column 93 shows the from simulation back-simulated/reconstructed/calculated line width 63 for the given determined input parameter set. FIG. 9a shows the result in a graph form 94 from PROX-In, where the goal is to find such a parameter set 95, which provides the best coincidence of measured data (black) 96 with calculated ones (red) 97.

Figures 10, 11:
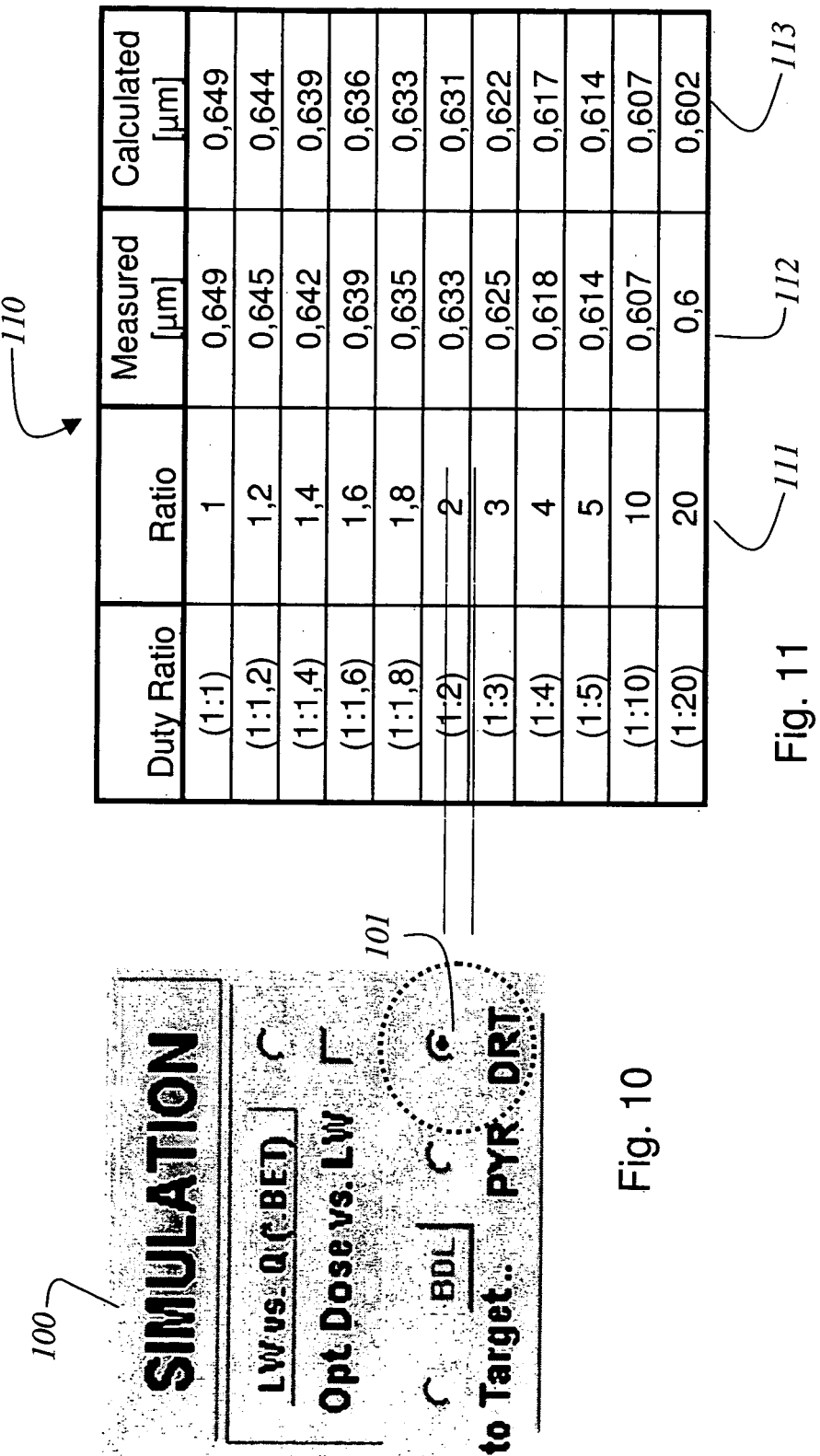
FIG. 10 shows an input window for the user to initiate the exposure of the second test pattern as shown in FIG. 7.
FIG. 11 shows a table of measurement result gained from the exposed second test pattern.

FIG. 10 shows an PROX-In input window 100 for the user to initiate the procedure of the second "DRT" test pattern 70 as shown in FIG. 7. The user selects the Duty-Ratio-Test procedure by setting a mark 101 above the indicated "DRT" name (check the "DRT" button) and the calculation process starts. The result is shown in a table 110 (see FIG. 11). The measurement result, gained from the exposed second test pattern 70 is disposed in three columns. The first column 111 contains data with the Duty-Ratio, the second column 112 contains data with the measured line widths and the third column 113 contains the calculated line widths from the back simulation.

Figure 11A:
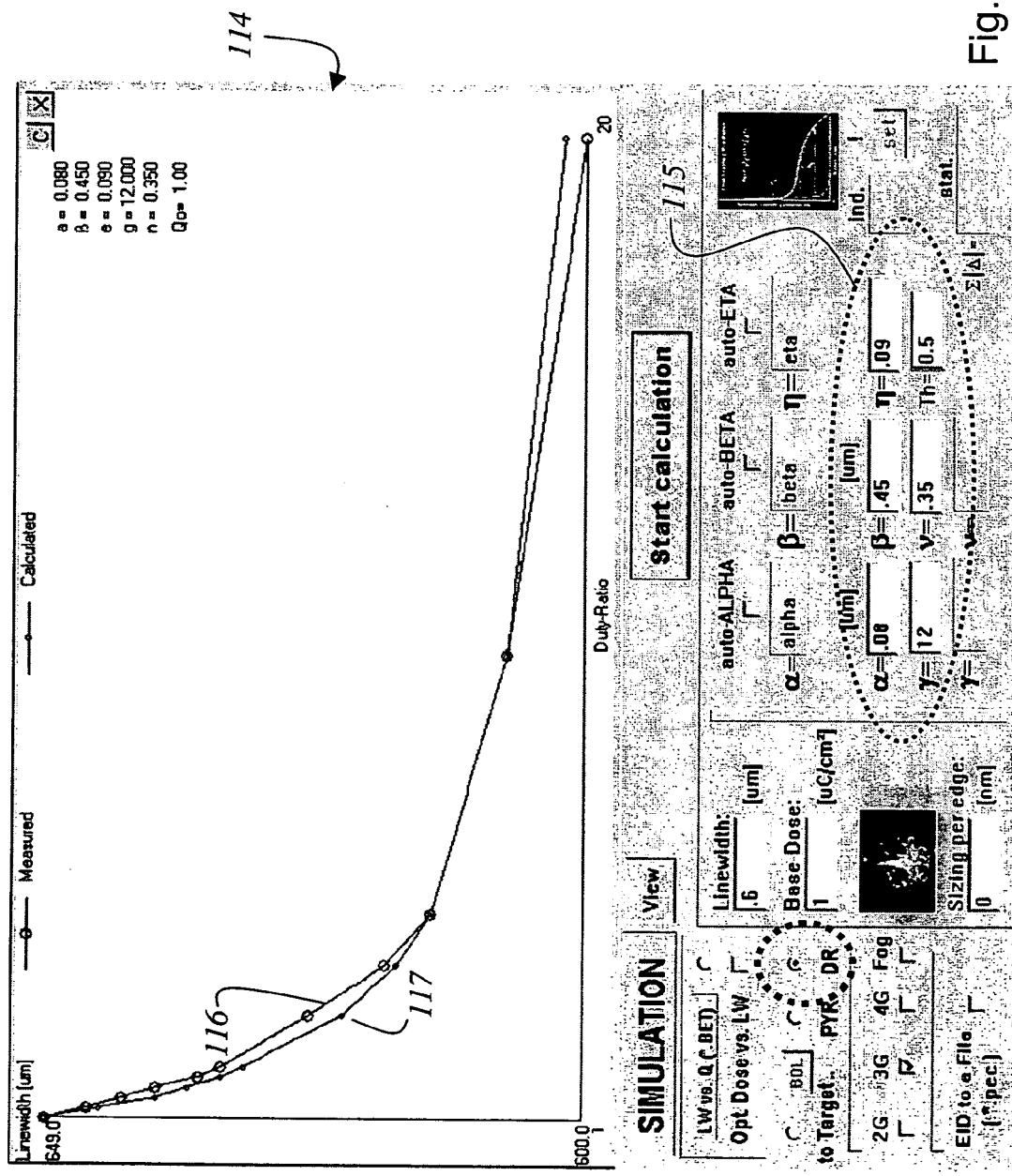
FIG. 11a shows the result in a graph form from PROX-In, where the goal is to find such a parameter set.

FIG. 11a shows the result in a graph form 114 from PROX-In, where the goal is (also the same as in the previous case with the pyramid-pattern) to find such a parameter set 115, which provides the best coincidence of measured data 116 with calculated ones 117.

It is obvious that other test patterns may be designed and used in order to gain additional experimental and simulated data to which the determined proximity parameters has to be cross checked and fitted. The fit provides a parameter set which allows exposure of couple of micro-patterns and the result gained is highly conform with the provided design data for the required pattern. In other words: any pattern exposed with the process according to the present invention result in patterns which have a dimension as required according to the design data.

The PROX-In runs on a standard computer 15. The computer 15 runs under Windows and does not need any specific hardware/software features. The installation of PROX-In is very easy. Create a separate directory and copy here the supplied/provided files. The general structure of PROX-In is clear from the main window 120 shown on a display 17 associated with the computer 15. The main window appears immediately after starting the program PROX-In (see FIG. 12). The main window 120 is divided into three main parts. A first part 121 is in the whole upper half of the main window 120. The first part is headed as "CALCULATION α" and "CALCULATION β and η". The first part 121 consists of a first, second third and fourth separate sub-box $121_1$, $121_2$, $121_3$ and $121_4$. The first sub-box $121_1$ is captioned as "ALPHA". The second sub-box $121_2$ is captioned as "BETA-MANUAL". The third sub-box $121_3$ is captioned as "BETA-AUTO". The fourth sub-box $121_4$ is captioned as "ETA". The sub-boxes serve for the quick and very first evaluation of the lithographic process response from measurements of relatively large patterns/wide lines and delivers the first (rough) numerical approach for the proximity parameters.

A second part 122 is poisoned at the bottom of the main window 120. The second part 122 is headed as "SIMULATION" and serves for the final "fine-tuning" of the parameters based on the best pattern reconstruction using back-simulation.

A third part 123 is located in the right-bottom side of the main window 120. The third part 123 is a scrolled "Input/Output" MEMO-box with a text window 124, where some necessary information appear that result from the selected operations/calculations.

New e-beam lithographic systems are designed to satisfy the CD-requirements at 100 nm device generation level and below. To meet these specifications it is necessary to have an adequate knowledge base covering all pattern-degradation/distortion effects through the whole process and also the consecutive application of the accurate correction methods.

In the e-beam lithographic system 1 the dominant distortion originates from the interaction of electrons with the resist/substrate system convoluted with additional effects, which are not exactly detachable and separately treatable. Here the major role plays the absorbed energy density distribution (AEDD) spread in the resist with the corresponding radiation-chemical event distribution in the resist volume creating the latent image (resist differentiation) in resist. A modeling of the AEDD in the resist layer is possible by using statistical (Monte Carlo) or analytical (Transport Equation) calculations of electron-scattering processes. The real latent image is then created by local chemical modifications of the irradiated resist volume after absorbing a necessary radiation quantum from the exposure.

The proximity correction control function $f(r)$ is usually described as a sum of two or more Gaussian functions (see Equation. 1).

In the case of a normalized 2G-function it reads as follows:

$$f(r) = \frac{1}{\pi(1+\eta)}\left\{\frac{1}{\alpha^2}\exp\left(-\frac{r^2}{\alpha^2}\right) + \frac{\eta}{\beta^2}\exp\left(-\frac{r^2}{\beta^2}\right)\right\} \quad \text{Equation 1}$$

where the first term α—characterizes the short-range of forward scattering, the second term β—the backscattering, the parameter η—is the deposited energy ratio of the backscattering component to the forward scattering component, and r—is the distance from the point of electron incidence (see FIG. 4a).

The final resist-relief mask will be obtained after the application of a post-exposure process (mostly a wet process) in a suitable developer. For the modeling and prediction of the real resist pattern geometry, the dissolution behavior of the polymer modified by radiation needs be exactly known. The development process brings into the whole simulation of a large amount of uncertainties, because of the highly non-linear behavior of this complicated thermo-hydro-kinetic process. Since a large variety of systems (semiconductor substrate, resist and post exposure process) exist, the parameters of equation 1 need to be determined for all the different systems.

In mask making a similar complication manifests also the second step—the pattern-transfer into the imaging layer and/or substrate through the resist in both wet and/or dry etching.

The correction of proximity effects in the field of e-beam lithographic systems, is available by some commercial software packages that all deal with exposure dose optimization issues based on the principle of using double or multiple Gaussian approximations of the electron-scattering phenomena as described above. If the input parameters are determined from Monte Carlo simulation exclusively, then the calculations involve only the pure AEDD. Such results do not contain any information about additional non-linear effects from other influencing elements. One influencing element is the process, for example radiation-chemical events in the resist, thermal effects, dissolution behavior in development and etching in mask making. An other influencing element is the tool, (for example, electron-optical aberrations and space charge effects affecting the aerial image slope and/or edge acuity), dependent impacts affecting the resulting pattern deformation. On this account the inputs for correction schemes should be estimated by using physical behavioral models, which exactly describe all these effects and, in addition, even finely tune the values of these parameters obtained from experimental measurements.

For the correction process only properly selected numerical inputs can bring this system to work. Therefore great efforts have been taken to develop a quick and easy method for the numerical determination of process-depending input parameter sets required to determine the exposure correction algorithms. The flexible program package PROX-In should help the lithographer to find/determine these optimized numerical values.

Special care was taken to synchronize both the algorithms of the corrector and the PROX-In software, respectively, to obtain the same results in the simulation mode for identical input parameters. The present invention uses a semi-phenomenological concept.

The proximity correction with the e-beam lithographic system 1 reduces the dimensional errors to <10 nm on masks for the 100 nm device generation and below.

Before starting "PROX-In", it is unavoidable to extract the following main numerical lithographic parameters directly from the set of specifically designed and exposed test patterns (needed as insert/setting parameters for the numerical calculation into PROX-In).

Figures 13, 14:
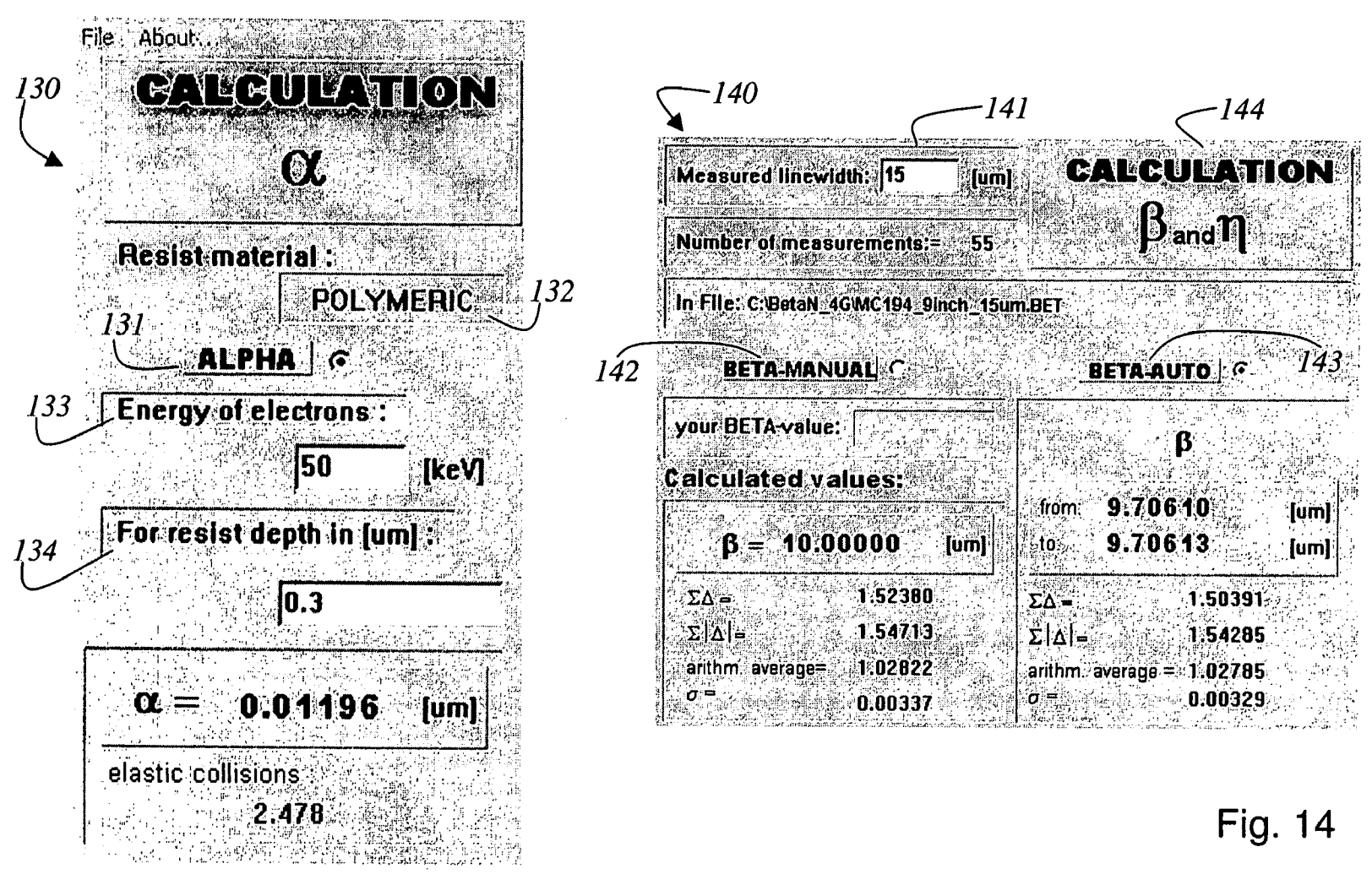

FIG. 13 shows a sub-window 130 of the first part 121 of the main window 120. In a first approach the α—parameter is be calculated from the Monte-Carlo calculation as a function of the actual energy of electrons and resist material and the thickness used. A selecting button "ALPHA" 131 in the sub-window 130 which is named "CALCULATION α" makes it possible to get an orientation α value (depending only on the pure elastic forward scattering of electrons independent of the substrate material) for a simple polymer material consisting of C, H, and O atoms (optional PMMA—($C_5H_8O_2$), with average density between 1.1-1.3 [g/cm$^3$]). The user has an input section 132 for the resist material, an input section 133 for the electron energy and an input section 134 for the resist depth. The calculation requires the input of the electron energy [keV] and the depth in resist [μm] where α should be determined.

Generally it is not recommended to directly use this obtained value α as an input into the correction procedure. This calculation only approaches the dependence of the α-value variation from the used exposure energy and the resist thickness. The real α-end-parameter will regularly have a bit larger value, because, apart from the forward scattering of electrons, other additional process—(development, etching) and/or tool dependent errors (optical aberrations, current-, pre-and post-exposure-process stability and reproducibility problems) influence this parameter.

The final α-parameter determination will be performed after the rough estimation of other input parameters (β, η . . . ) using the "back-simulation" for a real process.

FIG. 14 shows a sub-window 140 of the first part of the main window 121 on the display or user interface used for the calculation of β and η. The β-parameter represents the "long-range" impact of the proximity effect on the pattern deformations in e-beam lithographic systems. This means the β-value significantly and finely determines the final dose assignment over a large area of interacting and also non-interacting patterns in both clear and/or opaque modes respectively.

A "good" β-value estimation is therefore the crucial factor for a proximity correction working under practical conditions. This parameter is extremely sensitive to the substrate material composition (in many concrete cases an exact substrate definition for the statistical/analytical electron-scattering calculations is not possible).

In the sub-window 140 the user has an input section 141 to insert the value of the evaluated line width [μm]. The process will be started selecting the buttons "BETA-MANUAL" 142 or "BETA-AUTO" 143 in the sub-window 140 and by pushing a button "Start calculation" 144.

After starting the user is asked for an ASCII-text file of type (*.BET). The construction of this file requires data from measurements of test patterns which contains also non-corrected wide lines exposed with various doses.

Figure 15:
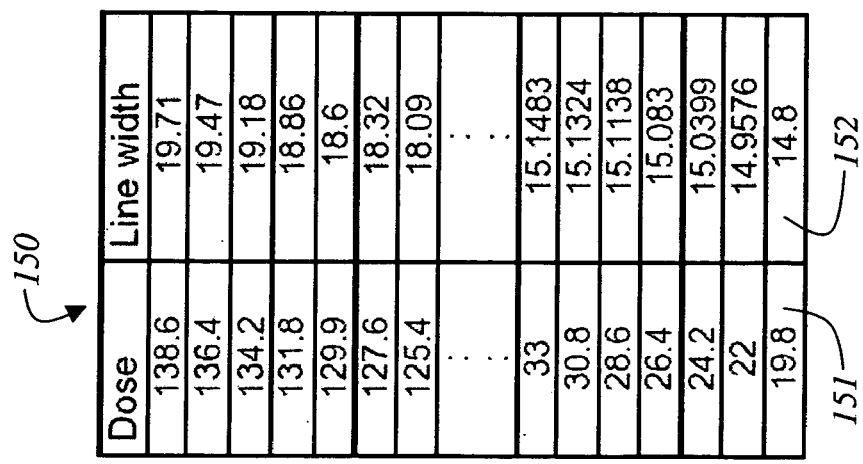
FIG. 15 shows a table of a exposed line width as a function of the applied dose.

FIG. 15 shows a table 150 of the (*.BET)-File, for a preparation wherein the dose [μC/cm$^2$] is displayed vs. the exposed line width [μm].

Measurements should be performed on an isolated wide line exposed with various doses. The result 160 of the measurement is visualized in FIG. 16. The measured line should be a pattern exposed as a long-isolated line of a width >β (to "collect all backscattering electrons", i.e. for 50 keV mask making ≧10 μm). The (*.BET) file (table 150) is written by using an arbitrary Text-Editor by direct insertion of the measured values as "Dose" [μC/cm$^2$]-Separator-"Linewidth" [μm] in two columns 151, 152, descending with dose value in ASCII-format, (see example in FIG. 15 for a 15 μm wide line). The measurement is taken by CD-measurement tools (for example Leica LMS-IPRO, Leica LWM, CD-SEM, or the like).

Figure 16:
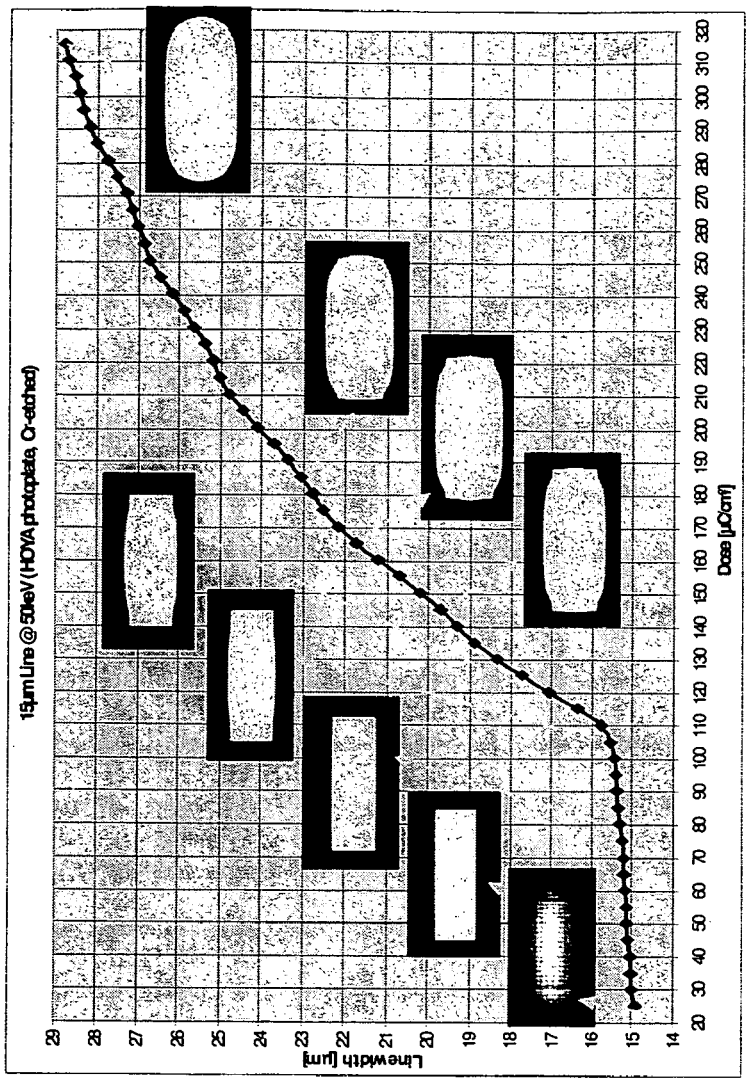
FIG. 16 shows a change in line width as a function of the dose exposed.

The method is based on the analysis of the line width variation vs. exposure dose (see FIG. 16). The dose is written on the abscissa and is increasing (with a fine step) from a smallest reasonable value through the optimum exposure (where the line width meets the target of 15 μm up to higher values (to approx. 10× the optimum dose). The measured line width is shown on the ordinate. A visualization of the whole effect of backscattering, together with all additional impacts from pre- and post-exposure processes is shown in FIG. 16 by the resulting line width and/or format. The specific β parameter for the given process configuration can be calculated by inserting the (*.BET)-file into the algorithm working under "BETA-MANUAL" and/or "BETA-AUTO".

Figure 17:
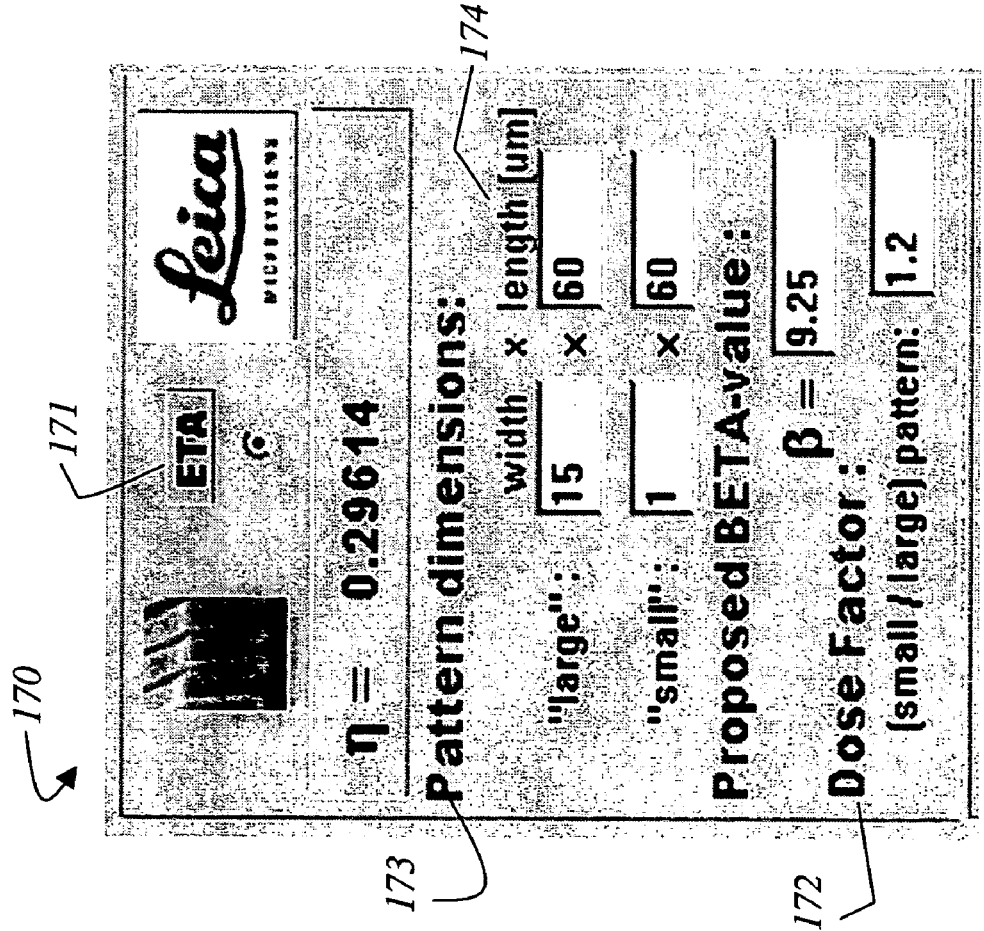
FIG. 17 shows a sub-window of the first part of the main window on the display or user interface used for the calculation of $\eta$.

FIG. 17 shows a sub-window 170 of the first part of the main window 120 on the display or user interface used for the calculation of η. A button "ETA" 171 initiates the calculation of "η" on the PROX-In main window 120. In order to carry out this step the previously determined β-value and two additional experimental values as inputs from the measurements of isolated clear, long, wide, and narrow lines are necessary. The η-value calculation requires the optimum dose factor (where the targets for both lines are met):

dose for a large pattern=Dose$_{large}$ (e.g. 10 μm or 15 μm exposed lines), and dose for a small pattern=Dose$_{lsmall}$ (e.g. ≦1 μm line) as a non-dimensional value:

$$\text{dose factor} = \frac{Dose_{small}}{Dose_{large}}.$$

This value has to be inserted into the position captioned as "Dose Factor" 172 and the exposed pattern dimensions into positions captioned as "Pattern Dimensions" "large" 173 and "small" 174 "width×length" in [μm]. After selecting the button "ETA" 171 and pushing the button "Start calculation" the η-value will be calculated and displayed in red (see FIG. 17).

A second portion 180 of the main window 120 is headed as "SIMULATION" and serves for the "fine-tuning" of the numerical input parameter set on a selected pattern. The parameter tuning is based on "Back-Simulation" of the measured dimensional variations of a pattern depending on the applied dose and/or neighborhoods. There are on disposal four types of patterns, by help of which it is possible to perform a back-simulation (FIG. 10). One pattern is a wide single clear line. The line width variation versus exposure dose is based on results obtained and the corresponding (*.BET)-file (see FIG. 15). A further possibility is relative Optimum Dose≡Dose Factor versus the line width for isolated clear lines for a width-range from minimally resolvable lines up to 2-3 μm (depending on the process). ASCII-data from measurements are gained in the form of line width versus. dose factor from a (*.TGT)-file. The corresponding data can be extracted from measurements of non-corrected exposed test patterns. A "PYR"—pyramid-like pattern—line width variation as a function of the programmed gap-width between the measured line and large, symmetrically exposed, pads along the measured line (see FIG. 6). Measurement data are required in ASCII-format from measurements in the following form: gap width versus line width as (*.PYR)-file. "DRT"—Duty Ratio Test—line width variation as a function of the line/space-pitch—Measurement data are required in ASCII-format from measurements in the following form: Line width versus. pitch as (*.DRT)-file.—Data can be extracted from the measurements on non-corrected test patterns (see FIG. 7). The main task of this simulation part, as displayed in the second portion 180 of the main window 120 is to find (iteratively) a reasonable set of input-parameters for the lithography model used. The simulation shows the best possible fit with measurements. That means, the simulation should reconstruct the real situation of the measured pattern geometry variation.

The main task of this simulation part is to find a reasonable set of input parameters for the lithography model used, where the simulation shows the best possible fit with measurements. That means, the simulation should reconstruct the real situation of the measured pattern geometry variation.

Before pushing a Start button 181 for a simulation the user has to chose one of the four pattern types ("LW vs. Q", "to Target . . . ", "PYR", "DRT") from which the corresponding ASCII-file is available with measured data. It is also necessary to fill-in all active Edit-Windows 182 with relevant numerical values and select the required model approach using a 2, 3, or 4 Gaussian representation.

Possible numerical ambiguities (e.g. not only one-value results and/or parameter values without a reasonable physical interpretation) may cause certain complications. Therefore we recommend to generally start the simulation with a "2G" 184 (two Gaussian) approach and as start values insert the β- and η-values obtained from the first rough approximation. As the starting value a number ranging between 0.05-0.1 μm can be set.

Figure 19:
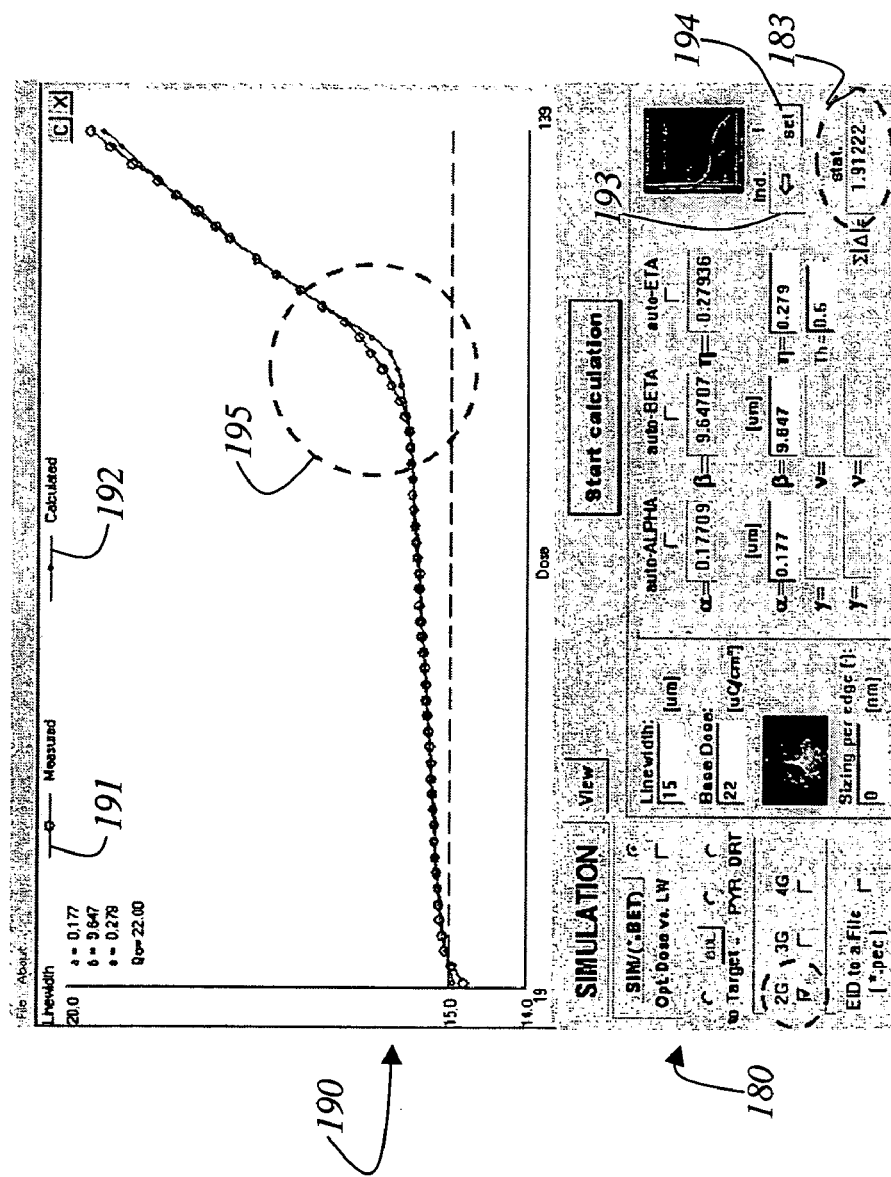
FIG. 19 shows a simulation of a 15 μm line width variation using "2G" approximation.

After starting the simulation a request for the corresponding ASCII-File appears (one of (*.BET), (*.TGT), (*.PYR), or (*.DRT) depending on the selected pattern type). If the file will be successfully read and interpreted by the program a new graphic window 190 (see FIG. 19) appears immediately in the top part of the second portion 180 of the main window 120 showing the results from the measurement 191 and related simulation 192 using the entered values in an appropriate graphic form.

Figure 12:
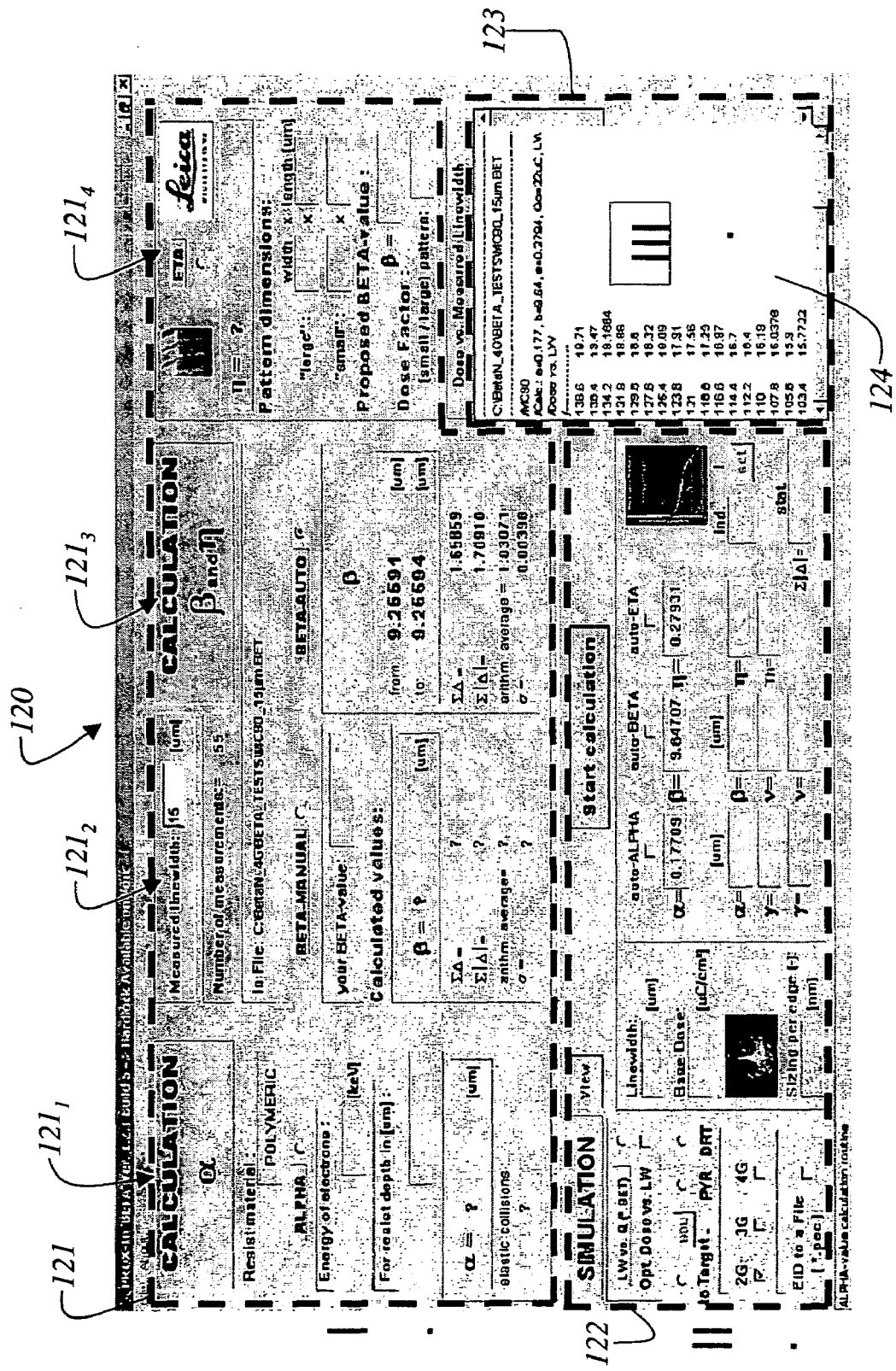
FIG. 12 shows the main window of the program PROX-In provided on the display associated with the computer.

Along with the graphics also a text information appears in the third part 123, located in the right-bottom side, of the main window 120 (see FIG. 12). The third part 123 contains the corresponding numerical comparison between experimental and calculated results with an evaluation of the fit-quality. The data can be directly handled in the third part 123 similarly as in an ordinary editor, i.e. mark the text, copy into clipboard, and also directly insert the copied ASCII-data into other software (e.g. Excel, . . . ) for further treatment.

Figure 18:
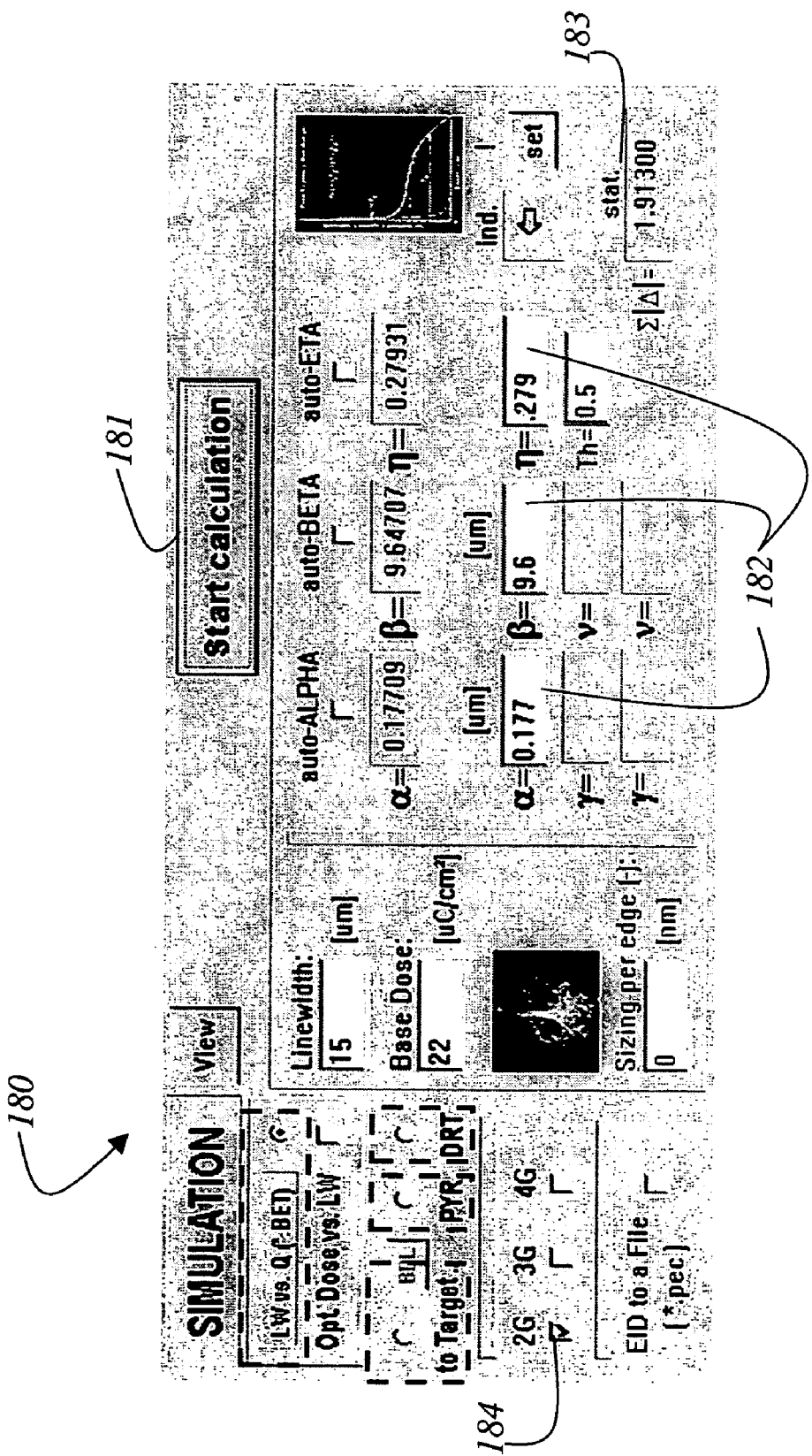
FIG. 18 shows a second portion of the main window (see FIG. 12) which serves for the "fine-tuning" of the numerical input parameters
Figure 20:
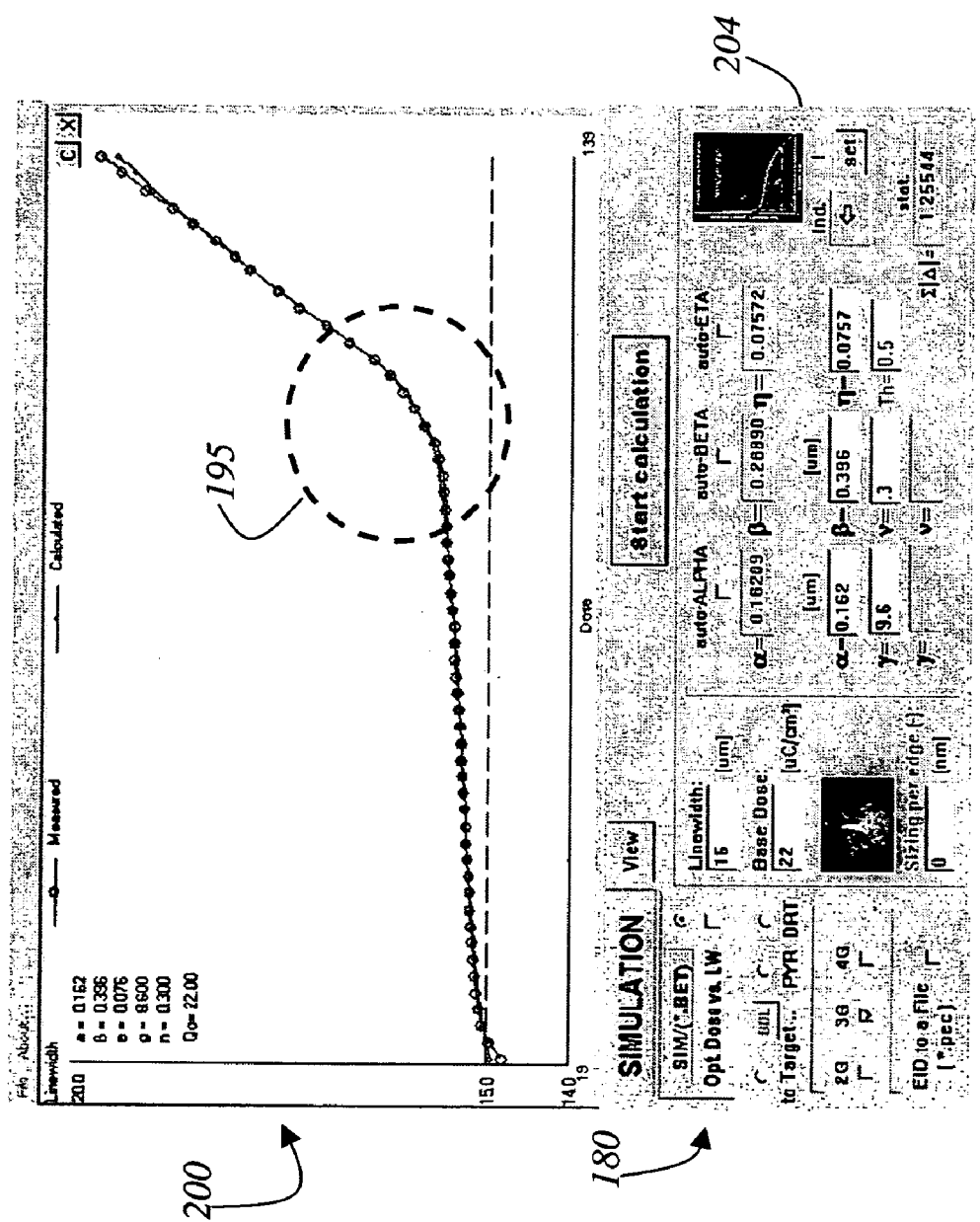
FIG. 20 shows a simulation of a 15 μm line width variation using "3G" approximation.

After each simulation step on the second portion 180 under "stat" 183 (see FIG. 18) a value appears indicating the quality of the just performed simulation. Generally, each step in the parameter-determination fitting process using the Back-Simulation method should tend to get the smallest possible value for "stat" 183 (e.g. see the difference in "stat" values between FIG. 19 and FIG. 20; obviously illustrating that FIG. 20 features the better fit 200).

The "ind" 193, 203 shows in form of an arrow "⇧"the quality-tendency of the fit among the fit-process. Pushing the "Set" button 194, 204 sets the current "stat" value as a min. for the quality evaluation and from now the indicator "ind" will show the fit-quality tendency in accordance to this value.

"ind"—meaning: "⇧"—worse; "⇩"—better, "⇐"—no significant change.

In case of a selected pattern type, except of "DRT", it is also possible to try separately each of the "auto-ALPHA", "auto-BETA", and "auto-ETA" functions (see FIG. 18) of the program (check the appropriate box, Note: only one must be checked at the same time!). The result is an optimized parameter value proposal for α or β or η appearing in the second portion 180 in red. If the calculated value proposal seems to be reliable, then it should be inserted into the appropriate Edit-Window below as a new value for the next simulation step. As a very first step in the auto-fit process it is recommended to start with the "auto-ETA" function—to find an approximately relevant and acceptable value of η. After inserting this value into the Edit-Window below the parameter-fit needs more iterations of many times through all input-parameters.

The boxes indicated as "3G" and "4G" (see the second portion 180 of the main window 120) are used to select more than two-Gaussian parameter sets. It often happens that some regions of the measurements cannot be satisfactorily fitted with simulations using the standard two Gaussian parameter sets (see FIG. 19; area marked with a dashed circle 195). In case the measured inputs of the line width variations are correct, this in reality could lead to a local failure of the optimised dose assignment for some combinations of patterns in the correction process. Using more than two Gaussians is in general possible in order to improve the quality of the fit (see FIG. 20).

If using "3G" or "4G" it is recommended to shift both numerical values β and η obtained from the "2G"-process as the last two parameters in "3G" or "4G", i.e. β⇒γ and η⇒ν. The new "blank" parameters β and η should be now set by some "small" starting values and step-by-step "tuned" to achieve the best fit. For a fine-tuning of α, β, and η the "auto-"-functions are useful.

Figure 21:
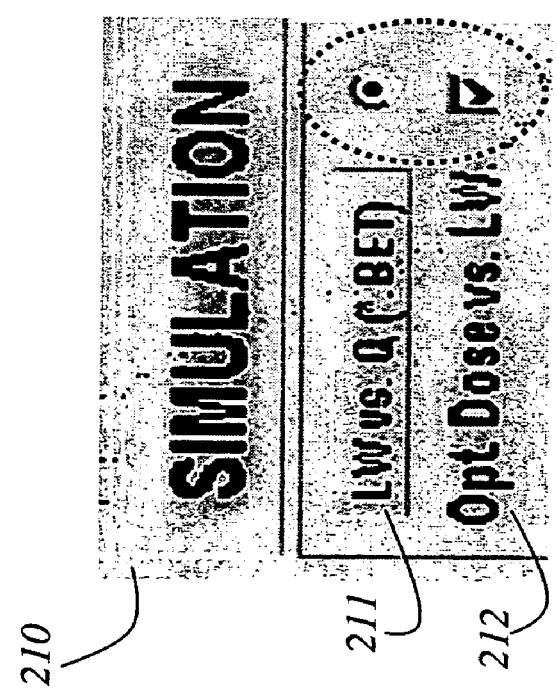
FIG. 21 shows a selection box.

FIG. 21 shows a selection box 210. The user selects the "LW vs. Q" 211 and simultaneously check also the "Opt. Dose vs. LW" box 212 below. This is an overall control procedure to get a general view about the correction process with the suggested input parameter set. The procedure does not need any input files. Since the result appears in a comprehensive table 220 (see FIG. 22) with calculated results from the model is created. The table 220 consists of seven columns and fourty six rows. Each row contains the calculated dose factors after correction for a given line width (exposed from 100 μm down to 50 nm). The columns in FIG. 22 have the following meaning: Column No.: 1.—Linewidth

[μm] 221, Column No.: 2.—Calculated optimum dose [μC/cm²] 222, Column No.: 3.—Dose Factor for a Single Clear Line 223, Column No.: 4.—Dose Factor for a Single-Clear-Contact 224, Column No.: 5.—Dose Factor for a Line in the middle of a L/S (1:1) large array 225, Column No.: 6.—Exposure Intensity Factor in the middle of a line taken from the middle of a (1:1) large array 226 and Column No.: 7.—Dose Factor for a Single Opaque Line 227.

Figure 23:
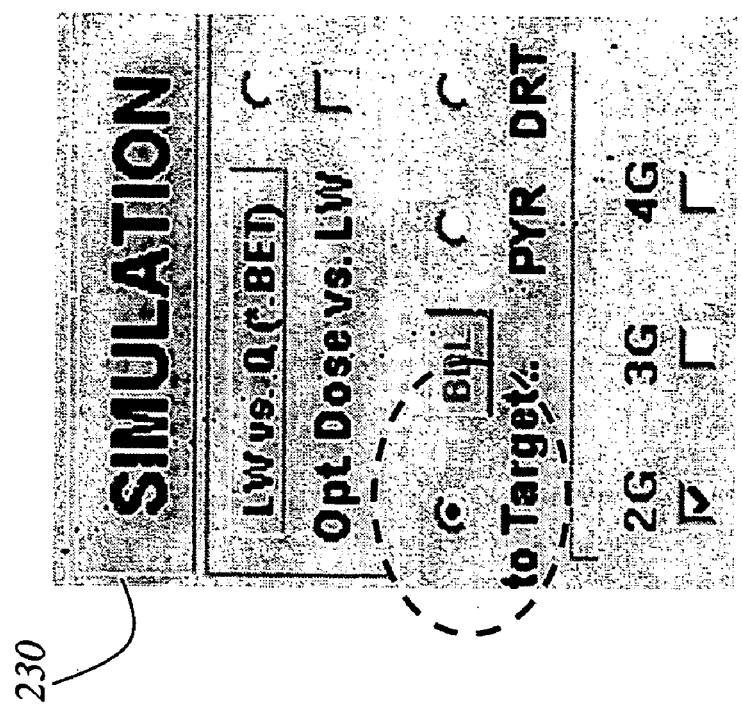
FIG. 23 shows a selection box.

FIG. 23 shows a selection box 230. The "to Target . . . " procedure allows the user to receive the optimised parameter sets from a precisely extracted "Correction Curve" for an optimum patterning of single-clear-lines down to the minimally obtainable dimensions for a given process.

Figure 24:
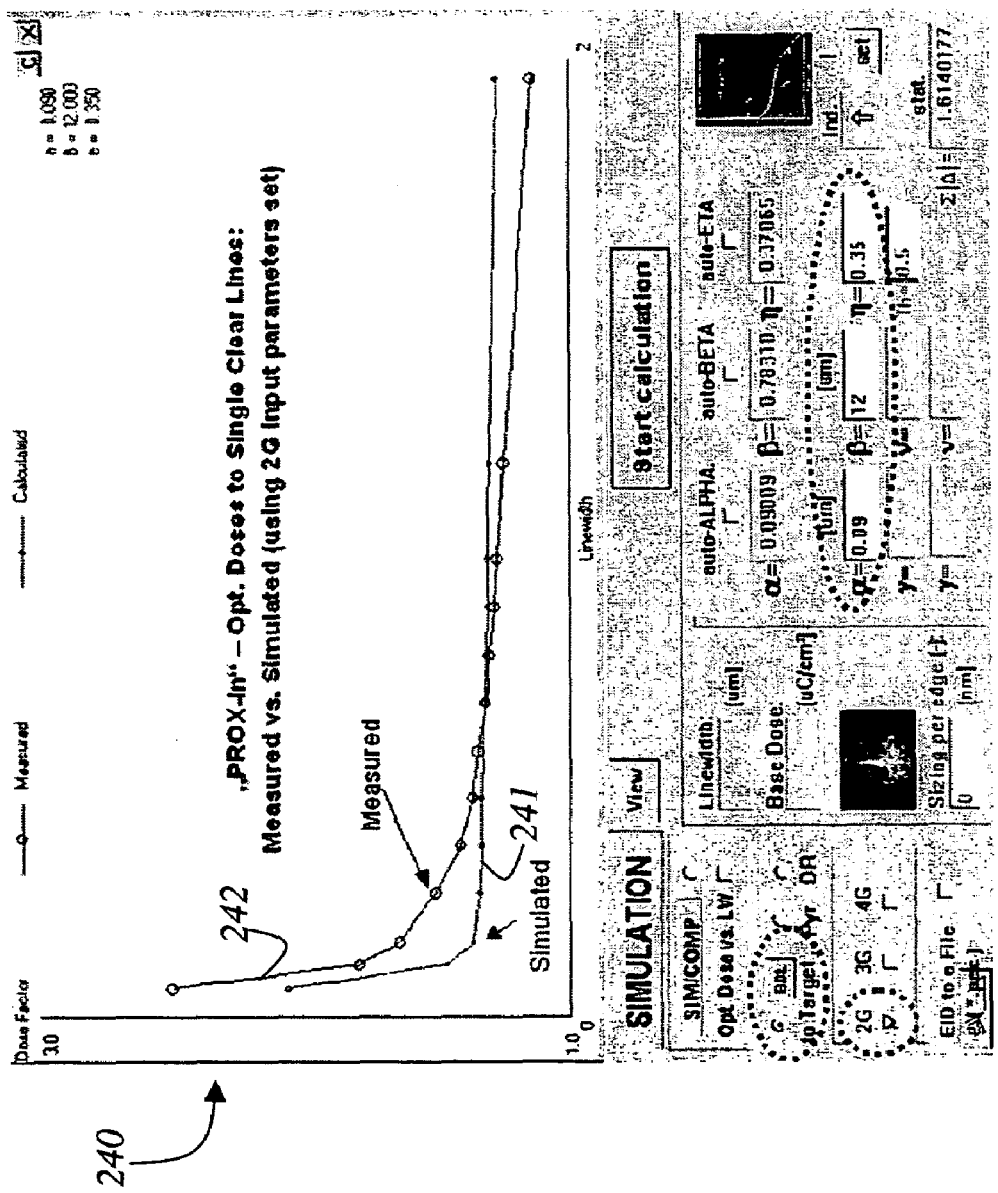
FIG. 24 shows the comparison of the optimal doses for a measured line width of a single clear line and the simulated one; using "2G" approximations.

FIG. 24 shows a comparison 240 of the optimal doses for a measured line width 242 of a single clear line and the simulated one; using "2G" approximations. The calculated "Correction Curve" 241 using the "2G" approximation does not provide the best fit with respect to the measured data of the line width.

Figure 25:
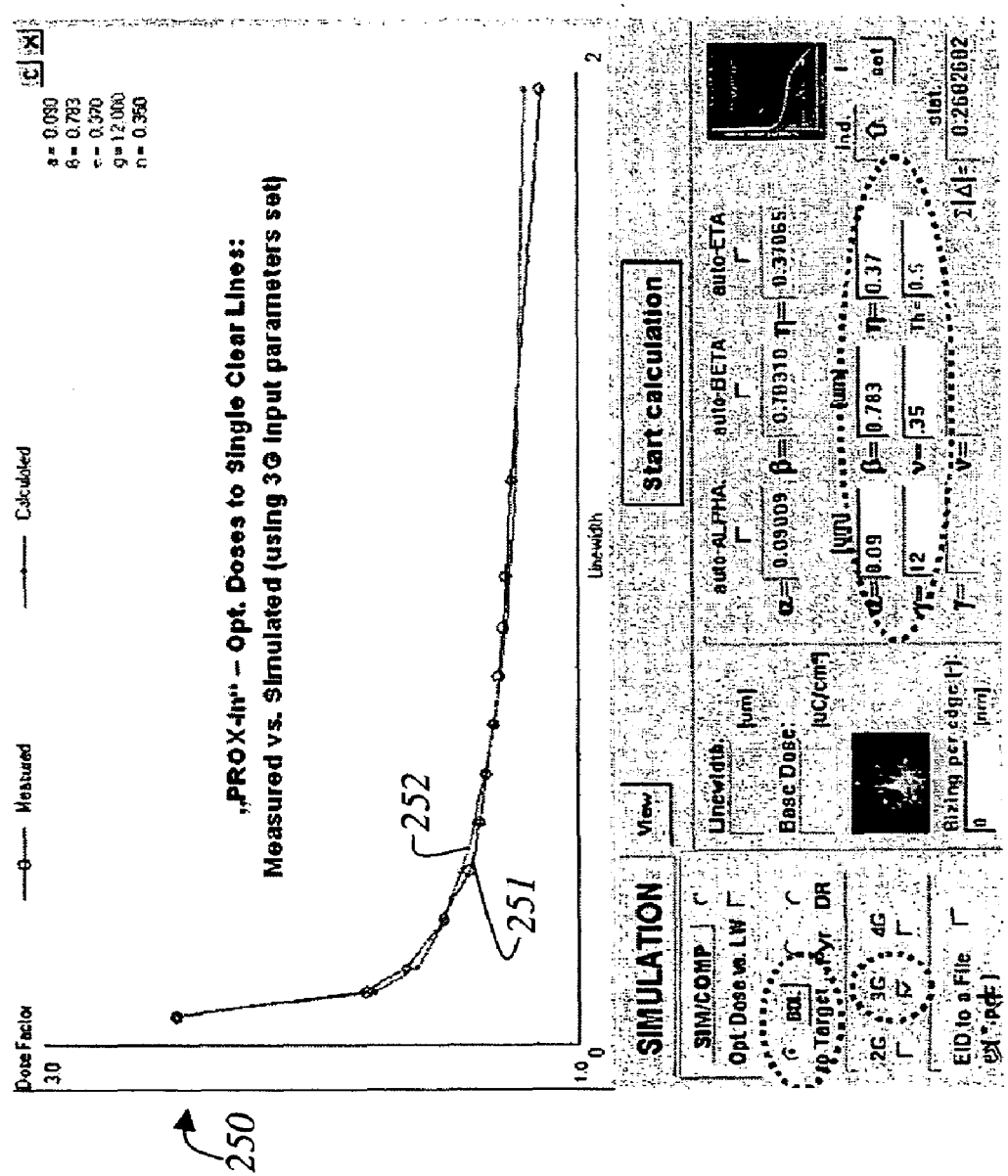
FIG. 25 shows the comparison of the optimal doses for a measured line width of a single clear line and the simulated one, using "3G" approximations.

FIG. 25 shows a comparison 250 of the optimal doses for a measured line width of a single clear line and the simulated one, using "3G" approximations. The calculated "Correction Curve" 251 using the "3G" approximation provides the best fit with respect to the measured data 252 of the line width.

Figure 26:
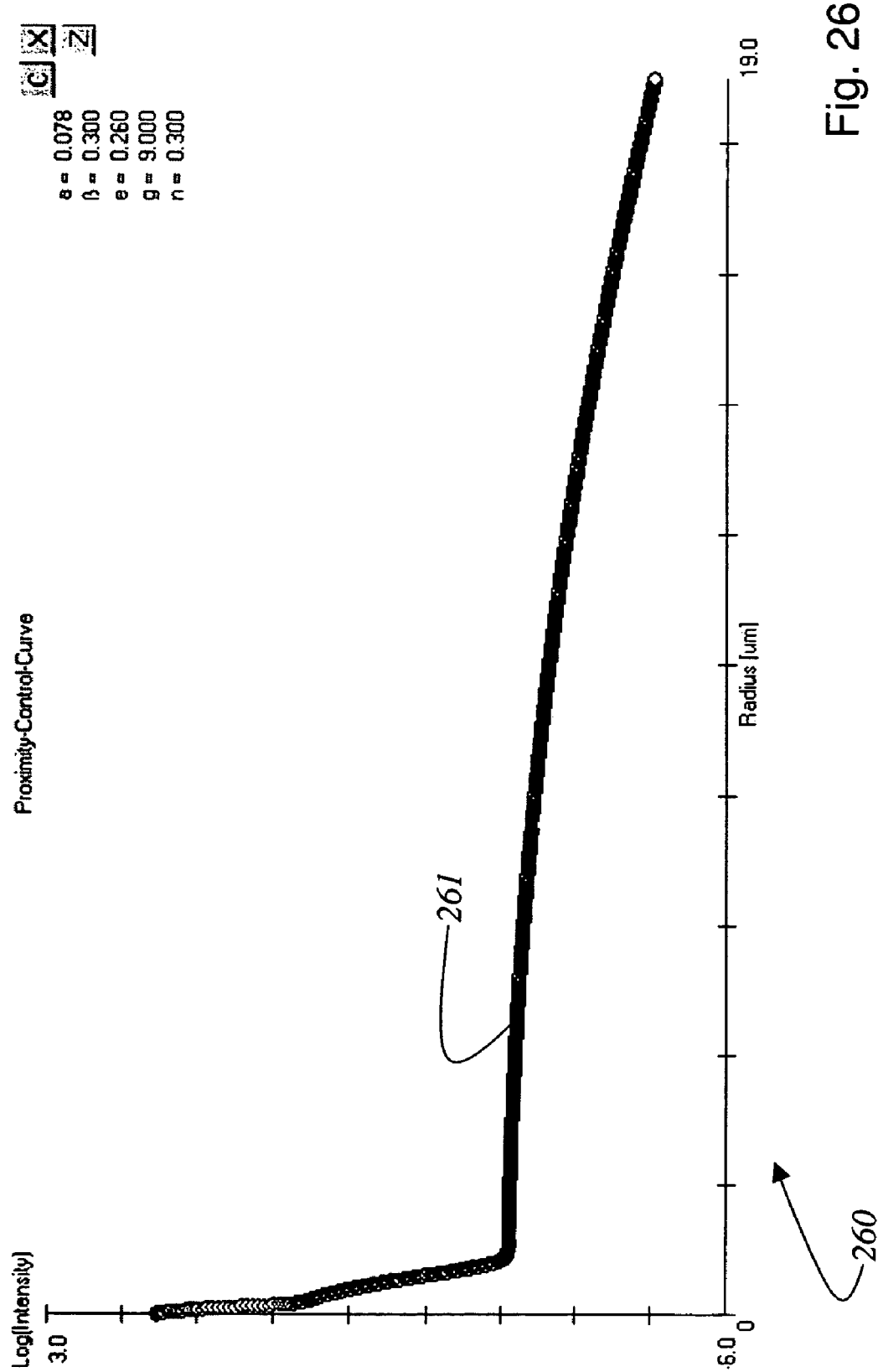
FIG. 26 shows a graph representation of the resulting control function.

FIG. 26 shows a graph 260 representation of the resulting control function 261. The very last step in the whole parameter set determination process is the generation of the control function 261 for the exposure process optimization. The control function 261 is fully determined by the proximity input parameters α, β, η, . . . obtained.

The resulting control function 261 in the form of an "EID" (Exposure Intensity Distribution) can be obtained in each step for one of the simulation steps after checking the "EID to a File (*.pec)" check-box. The procedure requires a File Name for the resulting "EID"-File (see FIG. 24). On the upper part of the display there appears a graph representation of the control function resulting as Radial Distance [μm] vs. Exposure Intensity [arbitrary units] (see FIG. 23).

Figure 27:
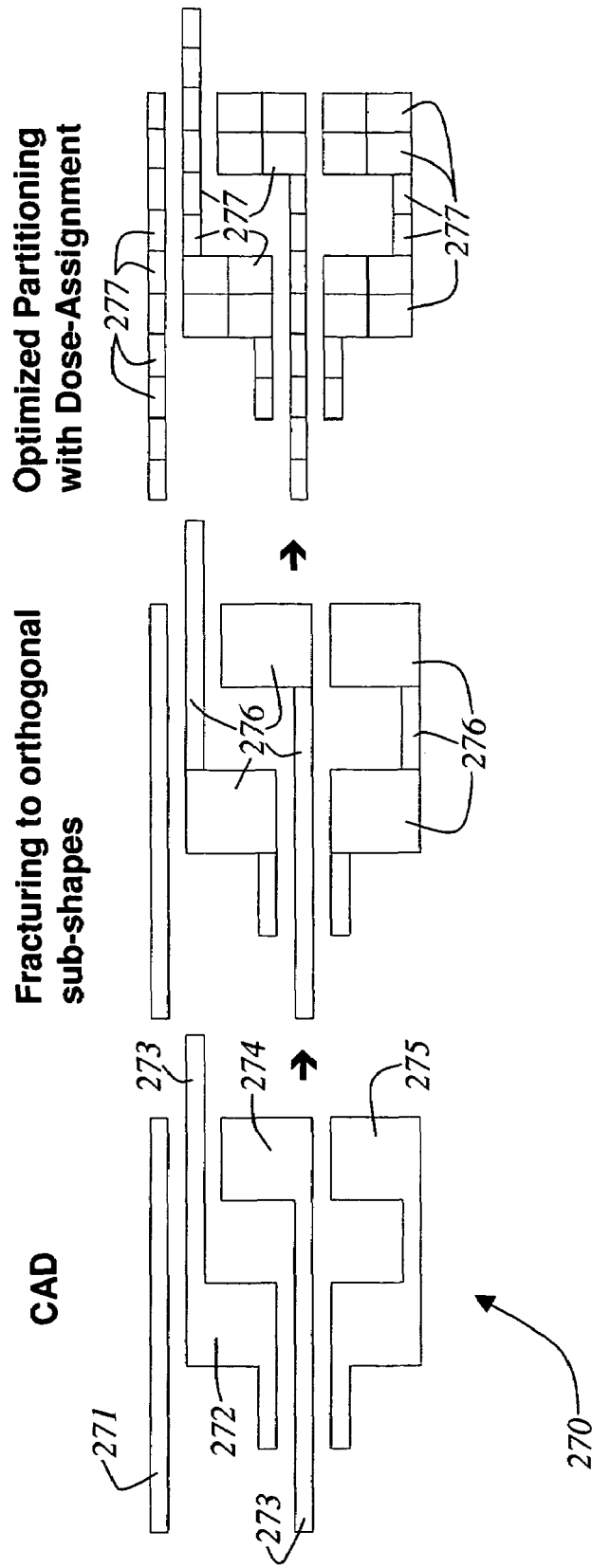
FIG. 27 shows a schematic representation pattern which is to be written by a lithographic process and the break-down of the pattern into subelements.

FIG. 27 shows a the form of a pattern 270 which needs to written in a resist on a substrate. The pattern 270 is provided by CAD-data and has in this embodiment four distinct features. The dimensions of the pattern 270 is clearly by the CAD-data or design data. The first feature is a straight line 271 with a defined width. The second feature 272 is a land of rectangular shape. A straight line 273 extends from the upper corner and form the lower corner of the land. The straight line 271 of the first feature is parallel to the straight line 273 extending from the second feature. The third feature 274 is a land of rectangular shape. A straight line 273 extends form the lower corner of the land to the left. The fourth feature 275 comprises two lands. The two lands are connected with a straight line 271 at their lower corners. An additional straight line extends from the upper corner of one land to the left. As already mentioned above the all straight lines 271 are parallel.

The pattern as defined by the CAD-design are divided into sub-shapes 276. To each sub-shape 276 a defined intensity of the e-beam for the lithography process is assigned. As a result from the process control and the resulting proximity correction the sub-shapes 276 are divided further and result in optimized sub-shapes 277. To each individual optimized sub-shape 277 a individual dose of the e-beam is assigned. The assignment of the dose is carried out according to the parameter set of best fit of the correction function.

Figure 28:
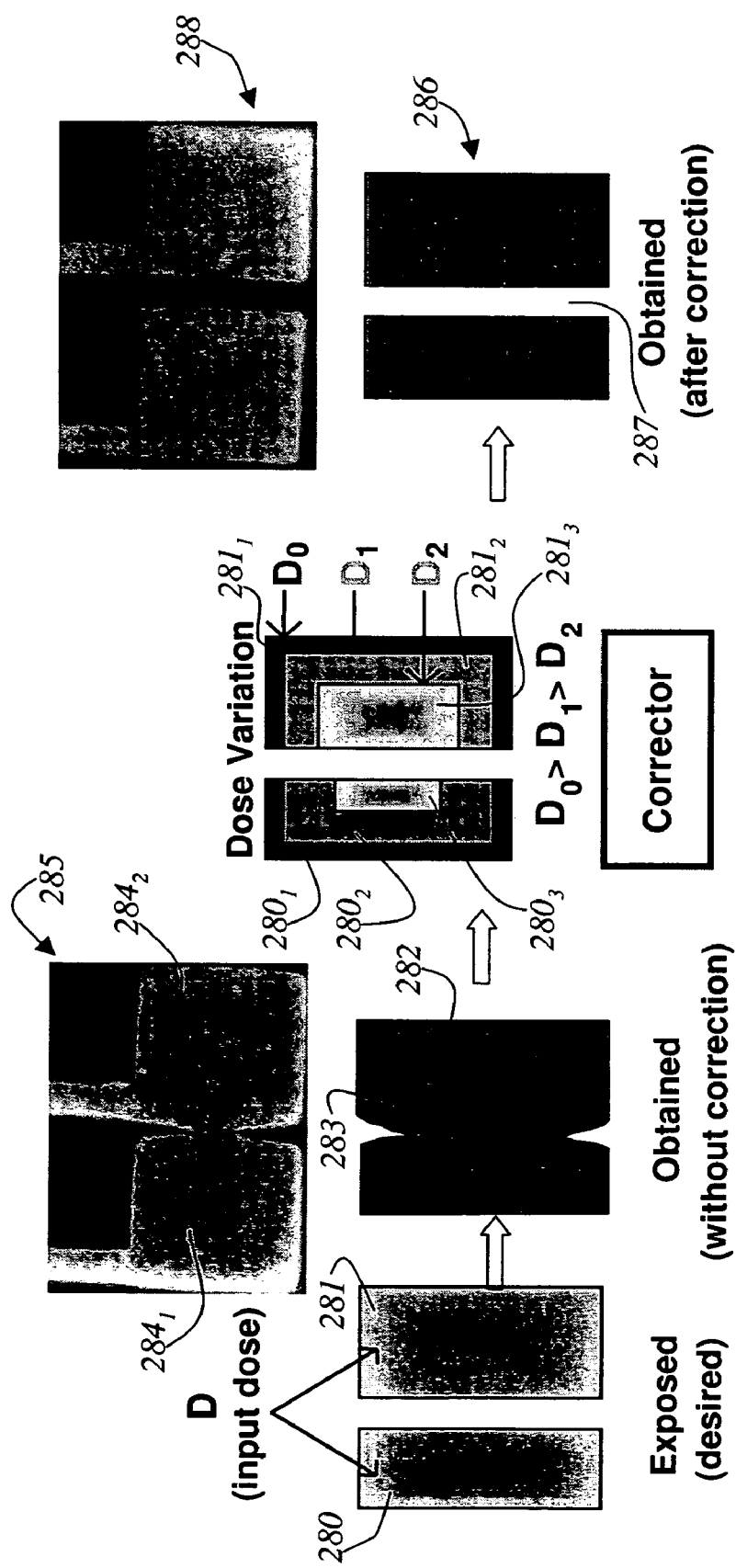
FIG. 28 shows a schematic representation of a pattern written with and without the applied control function.

FIG. 28 shows a schematic representation of a pattern written with and without the applied control function. To a first and a second area 280 and 281 a defined e-beam dose is assigned. A schematic representation 282 of the pattern resulting from the illumination by the e-beam shows a connection 283 between the individual lands $284_1$ and $284_2$. According to the CAD-data it is expected that the lands $284_1$ and $284_2$ are separated. The e-beam illumination causes the undesired connection between the two lands $284_1$ and $284_2$. A real image 285 of the structured pattern shows the connection between the two lands $284_1$ and $284_2$. According to the invention the first and the second area 280 and 281 are divided into at least two sub-areas $280_1, 280_2, \ldots, 280_n$ and $281_1, 281_2, \ldots, 281_n$ wherein a different dose is assigned to the sub-areas. According to the present embodiment the areas 280 and 281 are divided into three sub-areas $280_1$, $280_2$, and $280_3$. To each sub-area $280_1$, $280_2$, and $280_3$ an individual dose is assigned, wherein the first sub-area $280_1$ is subjected to a dose $D_0$, the second sub-area $280_2$ is subjected to a dose $D_1$, and the third sub-area $280_3$ is subjected to a dose $D_2$. As a result of the inventive assignment of the various doses to the various sub-areas a structure is obtained which has the dimensions as required by the CAD-data. A schematic representation of the various resulting structure 286 shows that there is a clear separation between the two structures. The separation is defined by a straight line 287 with a constant width. A real image 288 of the patterned structure is shown as well.

What is claimed is:

1. A process for controlling proximity effect correction in an electron beam lithography system, wherein exposure is controlled by a control function in order to obtain resulting patterns after processing which conform to design data, comprising the steps of:
    exposing an arbitrary set of patterns without applying the process for controlling the proximity correction;
    measuring the geometry of the resulting test structures and thereby obtaining a set of measurement data;
    determining basic input proximity parameters from the set of measurement data;
    fitting a model to the set of measurement data set and thereby obtaining an optimized set of proximity parameters;
    applying the control function to an exposure control of the electron beam lithography system during the exposure of a pattern according to the design data;
    individually changing at least the basic input proximity parameters of a control function; and
    applying the individually changed proximity parameters to a calculation and comparing the calculated results with the set of measurement data.

2. The process as claimed in claim 1, wherein the process comprises the step of applying the individually changed determined proximity parameters set to a calculation and a comparison of the results with the set of measurement data with nominal doses exposed isolated clear and opaque lines on the target.

3. The process as claimed in claim 1, wherein the process comprises the step of applying the individually changed proximity parameters set to a calculation and a comparison of the results with the set of measurement data from other arbitrary pattern, which is a pyramid like pattern and comparing the results with the measured data set from measurements in representative points on the exposed patterns.

4. The process as claimed in claim 1, wherein the process comprises the step of applying the individually changed proximity parameters to a calculation and a comparison of the results with the set of measurement data from other arbitrary pattern, which is a plurality of lines in Duty-Ratio and comparing the results with the measured data set from measurements in representative points on the exposed patterns.

5. The process as claimed in claim 1, wherein the control function is a sum of at least two Gaussian functions.

6. The process as claimed in claim 5, wherein the control function f(r) is determined by:

$$f(r) = \frac{1}{\pi(1+\eta)}\left\{\frac{1}{\alpha^2}\exp\left(-\frac{r^2}{\alpha^2}\right)+\frac{\eta}{\beta^2}\exp\left(-\frac{r^2}{\beta^2}\right)\right\},$$

wherein a first term α-characterizes the short-range of forward scattering, a second term β—the backacattering, a parameter η—is the deposited energy ratio of the backscattering component to the forward scattering component, and r—is the distance from the point of electron incidence.

7. The process as claimed in claim 1, wherein the control function is determined by a sum of three Gaussian functions.

8. The process as claimed in claim 1, wherein the control function is determined by a sum of four Gaussian functions.

9. The process as claimed in claim 1, wherein the pattern according to the design data is subdivided into optimized sub-shapes and an individual dose is assigned to each optimized sub-shapes, wherein the individual dose is determined from the correction function.

10. The process as claimed in claim 9, wherein the individual dose assigned to the optimized sub-shapes results in an exposed pattern which is in its dimensions identical to the design data.

11. The process as claimed in claim 1, wherein with the use of the proximity correction control function with the e-beam lithographic system the dimensional errors are reduced to less than 10 nm for the 100 nm device generation.

12. The process as claimed in claim 1, wherein the proximity control function is embedded in a software program.

13. The process as claimed in claim 12, wherein the software program runs on a standard computer which is connected to the e-beam lithographic system, a display is connected to the computer and a main window, as a user interface, is shown on the display, wherein the main window appears immediately after starting the software program and the main window is divided into three main parts.

14. The process as claimed in claim 13, wherein a first part of the main window consists of a first, second third and fourth separate sub-box and wherein the separate sub-boxes are used to calculate the proximity parameters.

15. The process as claimed in claim 13, wherein a second part of the main window serves for the "-fine-tuning-" of the numerical input parameter set on a selected test pattern, wherein the parameter tuning is based on "-Back-Simulation-" of the measured dimensional variations of a pattern depending on the applied dose and/or neighborhoods.

16. The process as claimed in claim 15, further comprising selecting four types of patterns to perform a back-simulation, a first pattern is a wide single clear line and the resulting line width variation versus the exposure dose is based on results obtained and a corresponding (*.BET)-file is generated, a second test pattern are isolated clear lines which should have a defined width, wherein a relative Optimum Dose≡Dose Factor versus the line width for isolated clear lines for a width-range from minimally resolvable lines up to 2-3 μm are exposed and ASCII-data are gained from measurements in the form of line width versus the dose factor from a (*.TGT)-file; a third test pattern is a "PYR"—pyramid-like pattern—wherein line width variation is obtained as a function of the programmed gap-width between the measured line and large, symmetrically exposed, pads along the measured line and the measurement data are in ASCII-format and displayed as a gap width versus a line width as (*.PYR)-file; the fourth test pattern is "DRT"—Duty Ratio Test—line width variation as a fbnerion of the line/space-pitch—Measurement and the data are in ASCII-format and displayed as a line width versus pitch as (*.PYR)-file, all the data are extracted from the measurements on non-corrected test patterns.

17. The process as claimed in claim 13, wherein a third part of the main window is located in a right-bottom side of the main window, the third part contains a corresponding numerical comparison between experimental data and calculated results with an evaluation of the fit-quality, wherein the data can be directly handled in the third part similarly as in an ordinary editor, such as mark the text, copy into clipboard, and also directly insert the copied ASCII-data into other software for further treatment.

* * * * *